(12) United States Patent
Oda et al.

(10) Patent No.: US 6,469,347 B1
(45) Date of Patent: Oct. 22, 2002

(54) BURIED-CHANNEL SEMICONDUCTOR DEVICE, AND MANUFACTURING METHOD THEREOF

(75) Inventors: Hidekazu Oda; Tomohiro Yamashita; Shuichi Ueno, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/553,487

(22) Filed: Apr. 20, 2000

(30) Foreign Application Priority Data

Oct. 20, 1999 (JP) .......................... 11-297878

(51) Int. Cl.[7] .............................. H01L 29/76
(52) U.S. Cl. .................. 257/345; 257/336; 257/338; 257/344
(58) Field of Search ................. 257/336, 338, 257/344, 369, 371–372, 376, 394, 398–400, 408, 402–404, 345

(56) References Cited

U.S. PATENT DOCUMENTS

| 5,864,163 A | * | 1/1999 | Chou et al. | 257/385 |
| 5,989,963 A | * | 11/1999 | Luning et al. | 438/162 |
| 6,078,082 A | * | 6/2000 | Bulucea | 257/345 |
| 6,100,568 A | * | 8/2000 | Lage | 257/392 |

FOREIGN PATENT DOCUMENTS

| JP | 1-214169 | 8/1989 | |
| JP | 2-203566 | 8/1990 | |
| JP | 4-192364 | 7/1992 | |
| JP | 05075041 A | * 3/1993 | 257/392 |

* cited by examiner

*Primary Examiner*—Minh Loan Tran
*Assistant Examiner*—Thomas L Dickey
(74) *Attorney, Agent, or Firm*—McDermott, Will & Emery

(57) ABSTRACT

MOS type semiconductor device is formed on the primary surface of a semiconductor substrate. A channel region includes a punch-through stopper layer, a lower counter-doped layer, and an upper counter-doped layer. The punch-through stopper layer is formed between the source region and the drain region and has a first concentration peak. The lower counter-doped layer is formed between the source region and the drain region, and has a second concentration peak at a position shallower than the position of the first concentration peak. Further, the upper counter-doped layer is formed between the source region and the drain region, and has a third concentration peak at a position shallower than the position of the second concentration peak. A buried-channel semiconductor device exhibits high punch-through characteristics and prevents an increase in a threshold voltage.

8 Claims, 20 Drawing Sheets

BURIED-CHANNEL SEMICONDUCTOR DEVICE, AND MANUFACTURING METHOD THEREOF

BACKGROUND OF THE INVENTION

1. Field of the Invention

The present invention relates to a metal-oxide-semiconductor (MOS) device and a manufacturing method therefor, and more particularly, to a buried-channel semiconductor device and a manufacturing method therefor.

2. Background Art

Advances in design technology and process technology have enabled manufacture of a highly integrated circuit on which are mounted a plurality of integrated circuits, which would have been manufactured separately. Attempts have been made to increase the degree of integration of a semiconductor circuit simultaneous with an increase in the processing speed of a processing unit, which can be achieved by means of assembling a processing unit into a one-chip CPU. A semiconductor memory device typified by static random access memory (SRAM) or dynamic random access memory (DRAM) and a highly integrated logic circuit (a logic circuit) including a micro-processing unit (MPU) are fabricated into a single chip. To manufacture such an integrated circuit, a plurality of MOS field-effect elements (hereinafter referred to as MOSFETs) whose configurations differ according to their objectives must be fabricated into a single chip.

MOS field-effect elements comprises an nMOSFET (negative Metal Oxide Semiconductor Field-Effect Transistor) which uses electrons as carriers, and a pMOSFET (positive Metal Oxide Semiconductor Field-Effect Transistor) which uses positive holes as carriers. A circuit is constituted by combination of these transistors. At the time of fabrication of these transistors within a single chip, both the gate electrodes of the nMOSFETs and the gate electrodes of the pMOSFETs are doped with n-type impurities in order to simplify manufacturing processes. The nMOSFETs are formed into surface-channel-type transistors, and the pMOSFETs are formed into buried-channel-type transistors, thereby preventing a decrease in migration of positive holes, the degree of which would otherwise be further decreased by means of a vertical electric field developing in the gate electrode. Such a buried-channel-type pMOSFET is described in, for example, Japanese Patent Application Laid-Open No. Hei-1-214169. The publication describes a semiconductor device, which is produced by means of implantation of two or more types of impurities such that the doping level of impurities within a channel region becomes greater toward the surface thereof, as well as a method of manufacturing the semiconductor device.

In association with miniaturization of an element, an electric current, a so-called punch-through current, which cannot be controlled by the gate electrode, occurs in the bottoms of source/drain regions of the element so as to flow from the source region to the drain region. In a semiconductor device described in, for example, Japanese Patent Application Laid-Open No. Hei-2-203566, in order to prevent occurrence of such a punch-through current, a heavily doped region which is equal in conductivity to a semiconductor substrate is formed within the semiconductor substrate at the bottom of the source/drain region. Japanese Patent Application Laid-Open No. Hei-4-192361 describes a semiconductor device, in which, in order to prevent occurrence of the punch-through current, the surface of the semiconductor substrate is formed into a lightly doped region which is of the same conductivity type as the source/drain region.

FIG. 20 is a cross-sectional view showing a conventional semiconductor device. In the drawing, reference numeral 101 designates a p-type semiconductor substrate; 102 designates an isolation oxide film; 103 designates a gate oxide film; 104 designates a gate electrode containing n-type impurities; 1051 designates an n-well; 1052 designates a p-well; 1061 designates a punch-through stopper, layer containing n-type impurities; 1062 designates a punch-through stopper layer containing p-type impurities; 107 designates a counter-doped layer containing p-type impurities; 1081 through 1084 designate p-type source/drain regions; 1091 through 1094 designate n-type source/drain regions; 1010 designates a side-wall spacer; 1011 and 1014 designate interlayer dielectric films; and 1012 and 1013 designate interconnections. The gate electrode 104 of the pMOSFET and the gate electrode 104 of the nMOSFET are doped with n-type impurities. P-type impurities, such as boron, are implanted into the pMOSFET, to thereby form the counter-doped layer 107 and preventing an increase in threshold voltage.

FIG. 21 is a cross-sectional view of a conventional semiconductor device, showing an enlarged view of a pMOS region shown in FIG. 20. The punch-through stopper layer 1061 is formed so as to prevent occurrence of a punch-through phenomenon at the bottom of any of the p-type source/drain regions 1081 to 1084 (denoted by points "a"). However, if there arises an increase in the doping level of the surface of the semiconductor substrate 1, the threshold voltage of the pMOS transistor is increased. To prevent such an increase in the threshold voltage, the semiconductor device is formed such that the peak of doping level appears in proximity to the bottom of the source/drain regions 1081 through 1084. Although a transistor having an LDD structure is illustrated as an example, the same also applies to a transistor which does not have any LDD structure. Further, the punch-through stopper layer 1062 formed in the nMOS region has the same structure as the punch-through stopper layer 1061.

In association with further miniaturization of an element, the distance between the source/drain regions has become shorter, so that punch-through has become more likely to arise. Occurrence of a punch-through phenomenon is prevented by increasing the doping level of the punch-through stop layer. However, an increase in the doping level of the punch-through stop layer raises a problem of a rise in threshold voltage.

If the doping level of the counter-doped layer 107 is increased in order to prevent an increase in the threshold voltage, the impurities induce a punch-through current by penetrating through the counter-doped layer 107 (denoted by points "b" shown in FIG. 21).

SUMMARY OF THE INVENTION

The present invention has been conceived to solve the problems described above, and the object of the present invention is to provide a semiconductor device which prevents occurrence of a punch-through phenomenon and an increase in the threshold voltage even when miniaturized, to thereby achieve high performance. The further object of the present invention is to provide a method of manufacturing such semiconductor device.

According to one aspect of the present invention, a semiconductor device comprises a semiconductor region of first conductivity type formed on the primary surface of a semiconductor substrate and surrounded by an isolation dielectric film. Source/drain regions of second conductivity type are formed on the primary surface of the semiconductor region so as to be separated a predetermined distance away from each other. A gate electrode of first conductivity type is formed on the primary surface of the semiconductor region with a gate insulation film interposed therebetween, so as to face a region sandwiched between the source region and the drain region. A first impurity region of first conductivity type is formed in a portion of the semiconductor region sandwiched between the source region and the drain region within the vicinity of the primary surface of the semiconductor region, and has a first concentration peak. A second impurity region of second conductivity type is formed within the region and in the vicinity of the primary surface of the semiconductor region. The second impurity region of second conductivity type has a second concentration peak at a position shallower than the position of the first concentration peak. A third impurity region of second conductivity type is formed within the region and in the vicinity of the primary surface of the semiconductor region. The third impurity region of second conductivity type has a third concentration peak at a position shallower than the position of the second concentration peak.

According to another aspect of the present invention, a semiconductor device comprises a semiconductor region of first conductivity type formed on the primary surface of a semiconductor substrate and surrounded by an isolation dielectric film. First source/drain regions of second conductivity type are formed on the primary surface of the semiconductor region so as to be separated a predetermined distance away from each other. A gate electrode of first conductivity type is formed on the primary surface of the semiconductor region with a gate insulation film interposed therebetween, so as to face a region sandwiched between the source region and the drain region. A first impurity region of first conductivity type which is formed in a portion of the semiconductor region sandwiched between the source region and the drain region in the vicinity of the primary surface of the semiconductor region, and has a first concentration peak. A second impurity region of second conductivity type is formed within the region and in the vicinity of the primary surface of the semiconductor region. The second impurity region of second conductivity has a second concentration peak located at a position shallower than the position of the first concentration peak. Second source/drain region of second conductivity type are formed on the primary surface of the area of the semiconductor region sandwiched between the first source region and the first drain region, so as to be separated a predetermined distance apart from each other. The second source/drain region of second conductivity type have a concentration peak at a position shallower than that of the second impurity concentration peak within the region and in the vicinity of the primary surface of the semiconductor region.

According to another aspect of the present invention, a semiconductor device comprises a semiconductor region of first conductivity type formed on the primary surface of a semiconductor substrate and surrounded by an isolation dielectric film. Source/drain regions of second conductivity type are formed on the primary surface of the semiconductor region so as to be separated a predetermined distance away from each other. A gate electrode of first conductivity type is formed on the primary surface of the semiconductor region with a gate insulation film interposed therebetween, so as to face a region sandwiched between the source region and the drain region. A first impurity region of first conductivity type is formed in the region sandwiched between the source region and the drain region and in the vicinity of the primary surface of the semiconductor region, and has a first concentration peak. A second impurity region of second conductivity type has a second concentration peak at a position shallower than the position of the first concentration peak and in the vicinity of the primary surface of the semiconductor region.

Sidewall spacers are formed on the side surface of the gate electrode and have substantially the same dimension in both thickness and height relative to the semiconductor substrate.

Other and further objects, features and advantages of the invention will appear more fully from the following description.

DETAILED DESCRIPTION OF THE PREFERRED EMBODIMENTS

Figure 1:
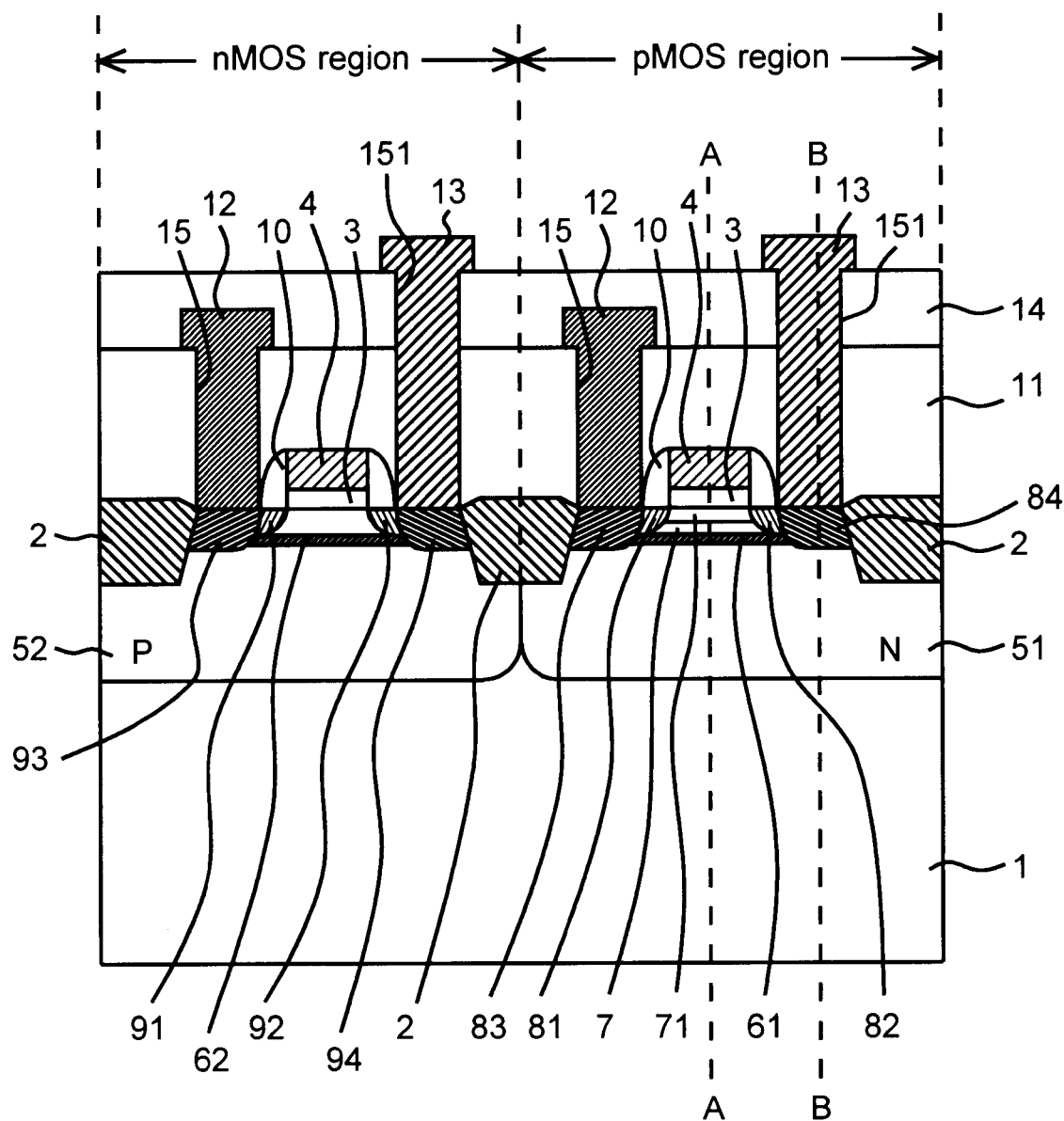
FIG. 1 is a cross-sectional view showing a semiconductor device according to a first embodiment of the present invention.

Preferred embodiments of the present invention will be described below with reference to the accompanying drawings, in which same or corresponding portions are indicated by same reference numerals.

First Embodiment

FIG. 1 is a cross-sectional view showing a semiconductor device according to a first embodiment of the present invention. In FIG. 1, reference numeral 1 designates a semiconductor substrate; 2 designates an isolation oxide film; 3 designates a gate insulation film; 4 designates a gate electrode; 51 designates an n-well; 52 designates a p-well; 61 and 62 designate punch-through stopper layers; 7 and 71 designate counter-doped layers; 81 through 84 designate p-type source/drain regions; 91 through 94 designate n-type source/drain regions; 10 designates a side-wall spacer; 11 and 14 designate interlayer dielectric films; 12 and 13 designate interconnections; and 15 and 151 designate contact holes.

The n-well 51, the p-well 52, the punch-through stoppers 61 and 62, the counter-doped layers 7 and 71, the p-type source/drain regions 81 through 84, and the n-type source/drain regions 91 through 94 are formed by doping the semiconductor substrate 1 with impurities.

In FIG. 1, a transistor is formed on the semiconductor substrate 1 containing n-type or p-type impurities at a specific resistance of 10 Ω·cm; that is, the semiconductor substrate 1 is doped with n-type or p-type impurities at a doping level of about $1\times10^{15}/cm^3$. Such a transistor is formed in a logic circuit, and the logic circuit is connected to a DRAM memory cell (not shown) by way of a sense amplifier (not shown), thus controlling the operation of a circuit. The DRAM memory cell is spaced away from a logic circuit, and the sense amplifier is fabricated between the DRAM memory cell and the logic circuit.

For instance, in a case where the gate electrode has a length L of about 200 nm, the isolation oxide film 2 has a width of about 200 to 500 nm and is formed to a depth of about 150 to 500 nm with reference to the surface of the semiconductor substrate 1, thereby separating active regions from each other. The width of an isolation region formed from the isolation oxide film 2 differs according to the layout of circuitry. The isolation region may assume a width of about 5000 nm. In such a case, the semiconductor substrate 1 (i.e., a dummy pattern) is left in the area where no elements are formed, to thereby appropriately adjust the width of the isolation region and minimize irregularities which arise in the surface of the isolation oxide film 2. In some cases, a silicon oxide film (not shown) is formed to a thickness of about 5 to 30 nm along a boundary surface between the isolation oxide film 2 and the semiconductor substrate 1, as required. In a case where defects, which arise in the semiconductor substrate 1, impose a sufficiently small influence on the characteristics of an element during a process of forming the isolation oxide film 2, the silicon oxide film may be omitted.

The conductivity types of the respective active regions separated by the isolation oxide film 2 are determined by the n-well 51 doped with n-type impurities, such as phosphorous or arsenic, at a doping level of about $1\times10^{18}/cm^3$ and the p-well 52 doped with p-type impurities, such as boron or boron fluoride, at a doping level of about $3\times10^{18}/cm^3$.

The gate insulation film 3 is formed from a silicon oxide film having a thickness of about 2 to 15 nm. A gate electrode 4 is formed on the gate insulation film 3 from a polysilicon film which has a thickness of about 200 to 300 nm and contains n-type impurities, such as phosphorous, at a doping level of about $1\times10^{20}/cm^3$ to $5\times10^{20}/cm^3$. In a case where the gate electrode 4 is formed into a multilayered structure comprising a polysilicon film and a metal silicide film, such as a cobalt silicide film, formed on the polysilicon film, the polysilicon film is formed to a thickness of about 150 to 250 nm, and the metal silicide film is formed to a thickness of about 40 to 60 nm (not shown).

The n-type source/drain regions 91 and 92 contain phosphorous or arsenic at a doping level of about $1\times10^{19}/cm^3$. Further, the n-type source/drain regions 93 and 94 contain impurities, such as phosphorous or arsenic, at a doping level of about $1\times10^{20}/cm^3$. Further, the p-type source/drain regions 81 and 82 contain impurities, such as boron or boron fluoride at a doping level of about $1\times10^{19}/cm^3$, and the p-type source/drain regions 83 and 84 contain impurities, such as boron, at a doping level of about $1\times10^{20}/cm^3$. Further, the p-type source/drain regions 81 through 84 and the n-type source/drain regions 91 through 94 have an LDD (lightly-doped drain) structure.

The punch-through stopper layer 61 is doped with n-type impurities, such as phosphorous or arsenic, with a peak doping level of greater than or equal to $1\times10^{17}/cm^3$ and a mean doping level of less than or equal to $3\times10^{18}/cm^3$. Further, the punch-through stopper layer 62 is doped with p-type impurities, such as boron or boron fluoride, with a peak doping level of greater than or equal to $1\times10^{17}/cm^3$ and a mean doping level of less than or equal to $3\times10^{18}/cm^3$. Each of the counter-doped layers 7 and 71 is doped with p-type impurities, such as boron or boron fluoride, with a peak doping level of greater than or equal to $1\times10^{17}/cm^3$ and a mean doping level of about less than or equal to $3\times10^{18}/cm^3$. The punch-through stopper layer 61 and the counter-doped layers 7 and 71 are formed so as to assume substantially the same doping level peak and such that their respective mean doping levels do not exceed the doping levels of the source/drain regions 81 and 82. Further, the mean doping level of the punch-through stopper layer 62 is set so as not to exceed the doping level of the source/drain regions 91 and 92.

Figure 2:
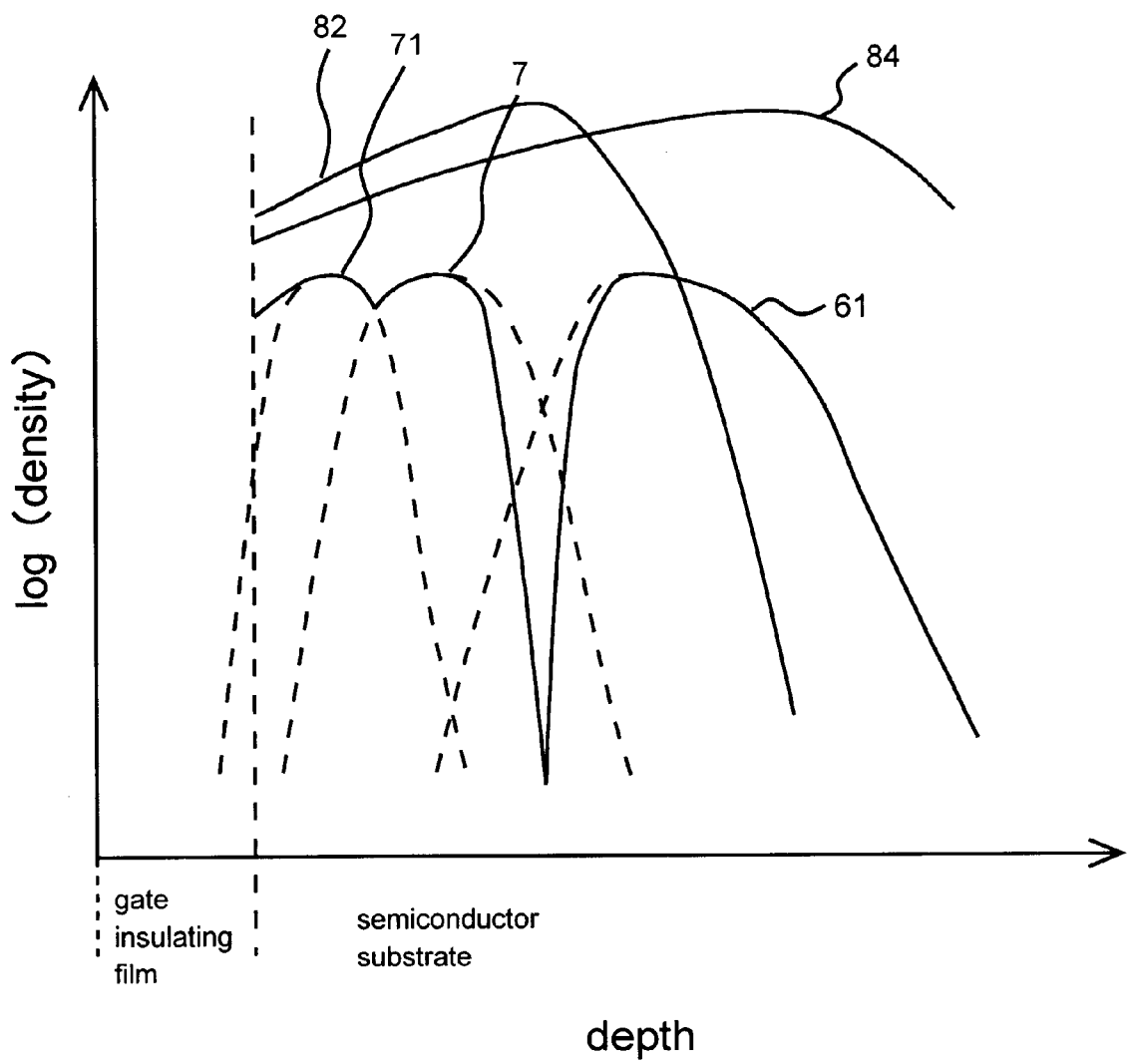
FIG. 2 is a graph showing a distribution of doping levels of the semiconductor device shown in FIG. 1.

FIG. 2 is a graph showing the distribution of doping level of the semiconductor device of the present invention; specifically, the doping levels of the counter-doped layers, 7 and 71 taken along line A—A shown in FIG. 1; the doping level of the punch-through stopper layer 61; the doping level of the source/drain region 84 taken along line B—B shown in FIG. 1; and the doping level of the source/drain region 82. The peak of doping level of the counter-doped layer 71 appears at a depth of about 10 nm with reference to the surface of the semiconductor substrate 1, and the peak of doping level of the counter-doped layer 7 appears at a depth of about 30 nm with reference to the surface of the semiconductor substrate 1. The peak of doping level of the source/drain region 82 appears at a depth of about 40 nm with reference to the surface of the semiconductor substrate 1. The locations of the peaks of the doping levels vary according to the depths of the source/drain regions 81 and 82. In association with a decrease 5 in the depths of the source/drain regions 81 and 82, the peaks of the doping levels of the counter-doped layers 7 and 71 appear at shallower positions.

As can be seen from the graph, a steep p-n junction is formed at the boundary surface between the counter-doped layer 7 and the punch-through stopper layer 61. Therefore, there is no anxiety concerning occurrence of a punch-through current, which would otherwise be caused by extension of a depletion layer in the p-n junction. The counter-doped layer 7 is formed on the surface and its doping level is maintained high, thereby preventing an increase in the threshold voltage of the transistor.

Figure 3:
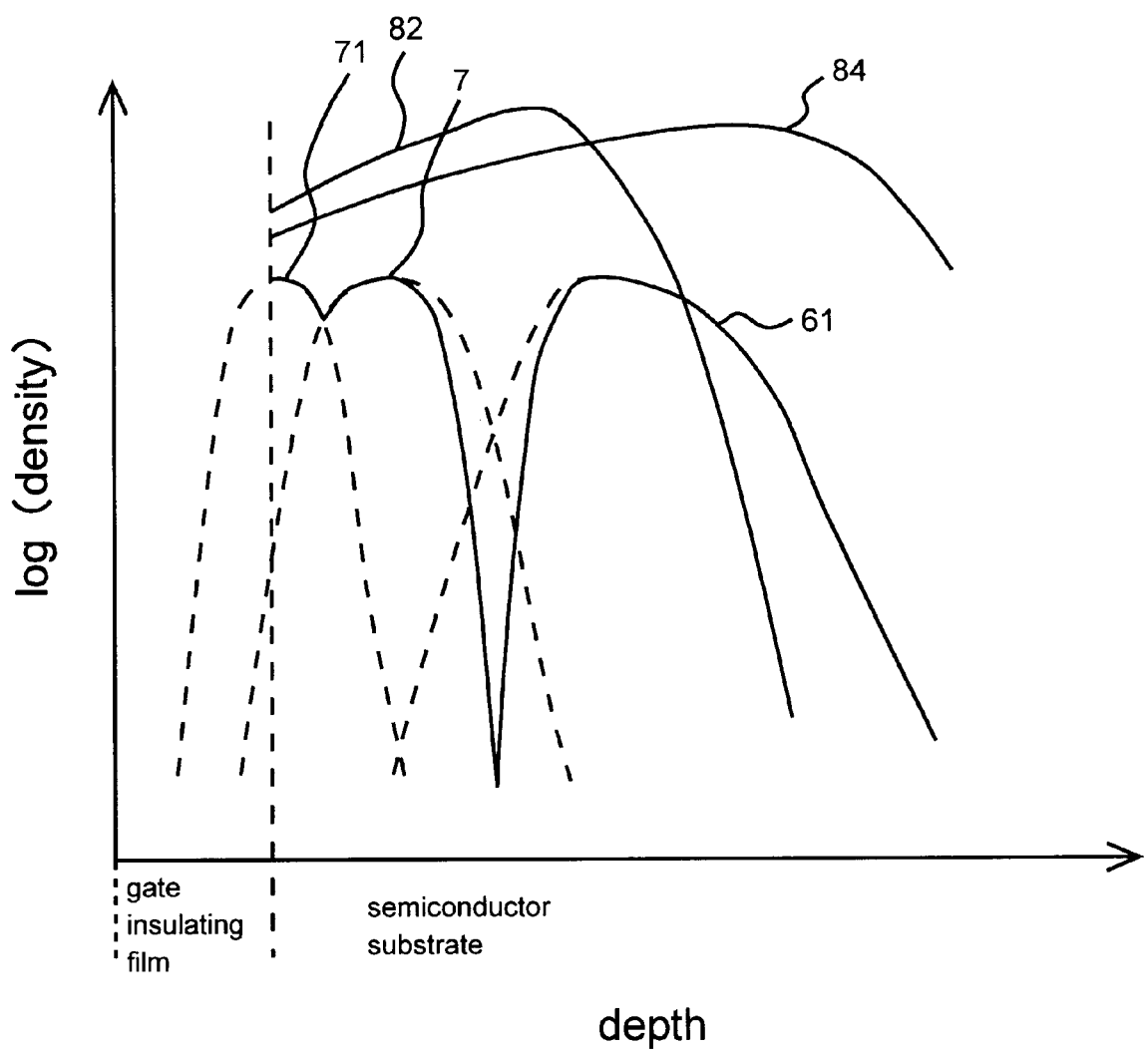
FIG. 3 is a graph showing another distribution of doping levels of the semiconductor device shown in FIG. 1.

Since a voltage is applied to the gate electrode, a channel is formed at a position on the surface of the semiconductor substrate 1 located beneath the gate electrode 4. As shown in FIG. 3, if the counter-doped layer 71 is formed such that the peak of the doping level thereof appears at a position on the surface of the semiconductor substrate 1, there is yielded an advantage of an improvement in performance of the transistor. At this time, the peak of doping level of the counter-doped layer 7 is set so as to appear at a depth of about 20 nm with reference to the surface of the semiconductor substrate 1.

Within a contact hole 15 formed in the interlayer dielectric film 11 made of a tetraethyl orthosilicate (TEOS) oxide film, the interconnections 12 are formed so as to connect to the source/drain regions 91 and 93 and the source/drain regions 81 and 83. Further, within a contact hole 151 formed in the interlayer dielectric film 14 made of a TEOS oxide film, the interconnections 13 are formed so as to connect to the source/drain regions 92 and 94 and the source/drain regions 82 and 84. The present embodiment shows one example layout of the interconnections 12 and 13. The number of interlayer dielectric films to be formed between transistors and the layout of the dielectric films differ according to the configuration of circuitry.

The operation of the semiconductor device will now be described. A channel is formed at a position on the surface of the semiconductor device 1 located beneath the gate electrode 4, by application of voltages to the gate electrode 4, the source/drain regions 81 through 84, the source/drain regions 91 through 94, and the semiconductor substrate 1 (the wells 51 and 52). One of the source/drain regions acts as a source, and the remaining region acts as a drain. For instance, in the case of an NMOS transistor, the following voltages are applied to individual electrodes of the transistor: i.e., $V_G$=1V, $V_P$=1V, $V_S$=0V, and $V_B$=0V. In the case of a PMOS transistor, the following voltages are applied to individual electrodes of the transistor: i.e., $V_G$=0V, $V_P$=0V, $V_S$=1V, and $V_B$=1V. These voltages are provided as one example combination and vary according to the thickness of the gate insulation film 3 and the length of the gate electrode 4.

Although the present embodiment is described with reference to a CMOS transistor taken as an example, the present embodiment may also apply to a buried-channel PMOS transistor only or a buried-channel NMOS transistor only. In the case of an NMOS transistor, the conductivity types of all the regions of the semiconductor device, exclusive of the semiconductor substrate 1, are set so as to become the reverse of the conductivity types of the corresponding regions as described above.

Figure 4:
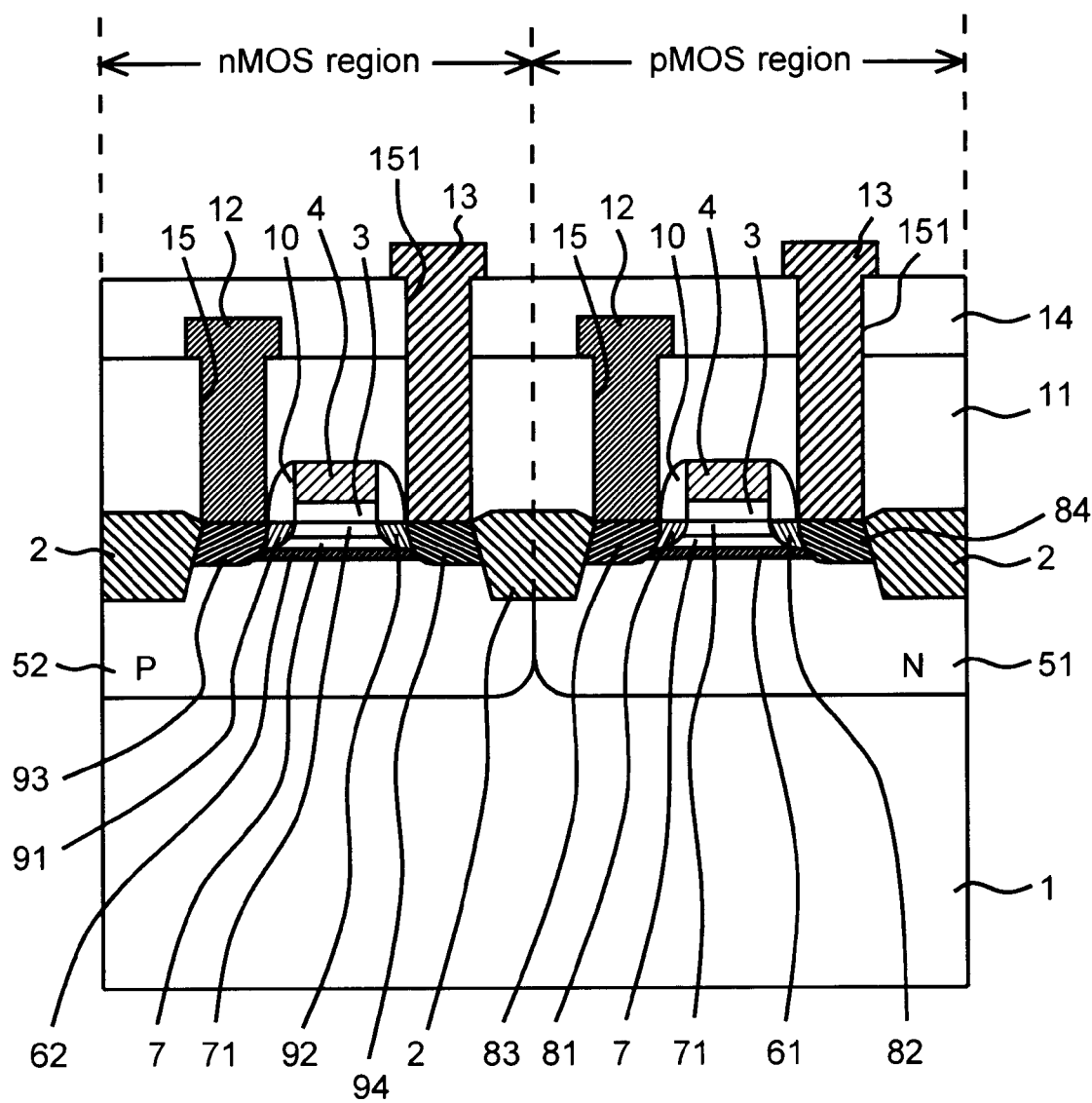
FIG. 4 is a cross-sectional view showing another semiconductor device according to a first embodiment of the present invention.

Further, in a case where metal, such as tungsten, is used as the material of the gate electrode 4 in order to reduce the resistance of the gate electrode 4, the threshold voltage of the nMOS region and the threshold voltage of the pMOS region are increased. Therefore, in suc a case, as shown in FIG. 4, both the NMOS transistor and the PMOS transistor are formed so as to assume a buried-type structure, and the counter-doped layers 7 and 71 are formed in the NMOS transistor. Each of the counter-doped layers 7 and 71 is doped with n-type impurities, such as phosphorous or arsenic, with a peak doping level of greater than or equal to $1 \times 10^{17}/cm^3$ and a mean doping level of about less than or equal to $3 \times 10^{18}/cm^3$.

Although, in the present embodiment, the isolation oxide film 2 is exemplified by a trench isolation structure, the isolation oxide film 2 may also be embodied by another isolation method such as the LOCOS (local oxidation of silicon) process.

In the semiconductor device of the first embodiment, even when a semiconductor device having a buried-channel structure is miniaturized, the punch-through stopper layer 61 can prevent occurrence of a punch-through phenomenon in the area between the bottoms of the source/drain regions 83 and 84. Further, presence of the counter-doped layer 71 prevents occurrence of a punch-through phenomenon, to thereby yield an advantage of preventing a rise in the threshold voltage of the semiconductor device.

When a voltage is applied to the gate electrode 4, a channel is formed at a position on the surface of the semiconductor substrate 1 located beneath the gate electrode 4. As a result, there is yielded an advantage of a further improvement in the performance of the device as a result of the peak of doping level of the counter-doped layer 71 being located closer to the surface of the semiconductor substrate 1.

The semiconductor device according to the first embodiment as described above maybe summarized as follows. The semiconductor device comprises a semiconductor region of first conductivity type (n-well 51) formed on the primary surface of a semiconductor substrate (semiconductor substrate 1) and surrounded by an isolation dielectric film (isolation oxide film 2). Source/drain regions of second conductivity type (source/drain regions 81–84) are formed on the primary surface of the semiconductor region so as to be separated a predetermined distance away from each other. A gate electrode of first conductivity type (gate electrode 4) is formed on the primary surface of the semiconductor region with a gate insulation film interposed therebetween, so as to face a region sandwiched between the source region and the drain region. A first impurity region of first conductivity type (punch-through stopper layer 61) is formed in a portion of the semiconductor region sandwiched between the source region and the drain region within the vicinity of the primary surface of the semiconductor region, and has a first concentration peak. A second impurity region of second conductivity type (counter-doped layer 7) is formed within the region and in the vicinity of the primary surface of the semiconductor region, and has a second concentration peak at a position shallower than the position of the first concentration peak. Further, a third impurity region of second conductivity type (counter-doped layer 71) is formed within the region and in the vicinity of the primary surface of the semiconductor region, and has a third concentration peak at a position shallower than the position of the second concentration peak.

A method of manufacturing the semiconductor device of the first embodiment will now be described.

Figure 5:
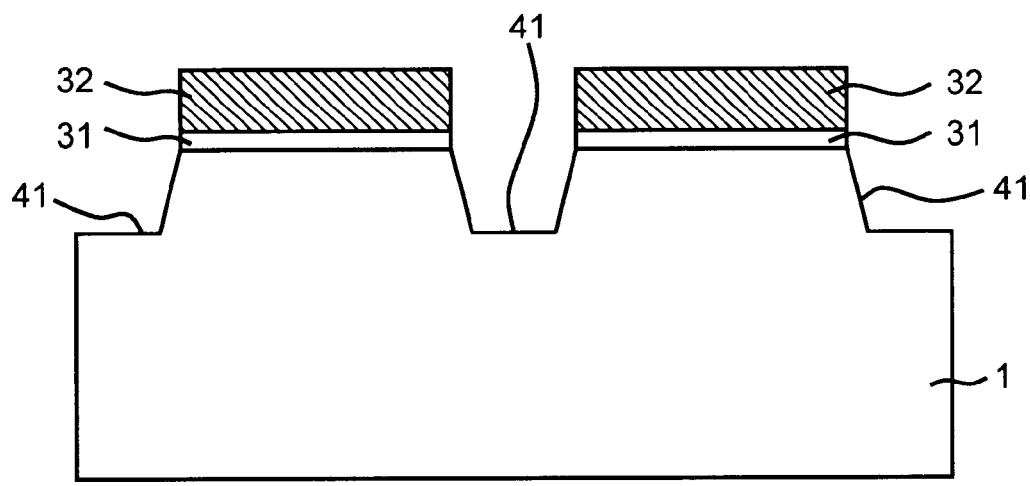
FIGS. 5 through 10 are cross-sectional views showing a process of manufacturing a semiconductor device of the first embodiment in the present invention.

FIGS. 5 through 10 are cross-sectional views showing a process of manufacturing a semiconductor device of the first embodiment. In FIG. 5, reference numeral 31 designates a silicon oxide film; 32 designates a silicon nitride film; and 41 designates a trench. As shown in FIG. 5, the silicon oxide film 31 is formed on the surface of the semiconductor substrate 1 to a thickness of about 5 to 30 nm, and the silicon nitride film 32 is formed on the silicon oxide film 31 to a thickness of about 100 to 300 nm. The portions of the silicon nitride film 32 and the silicon oxide film 31 which correspond to isolation regions are selectively and anisotropically etched away through use of a photoresist mask (not shown). After removal of the photoresist mask, the semiconductor substrate 1 is anisotropically etched while the silicon nitride film 32 is taken asia mask, to thereby form the trenches 41 in the surface of the semiconductor substrate 1 to a width of about 200 to 500 nm and a depth of about 150 to 500 nm. FIG. 5 is a cross-sectional view showing the elements of the semiconductor device after completion of the foregoing process.

If defects, which would adversely affect the elements, are formed in the elements after formation of the trenches 41, the semiconductor substrate is subjected to thermal oxidation in the course of this process, to thereby form a silicon oxide film (not shown) on the surfaces of exposed portions of the semiconductor substrate 1 after formation of the trenches 41, by means of thermal oxidation. If defects are considered to exert only small influence on the characteristics of the elements, a thermal oxidation process may be omitted.

Figure 6:
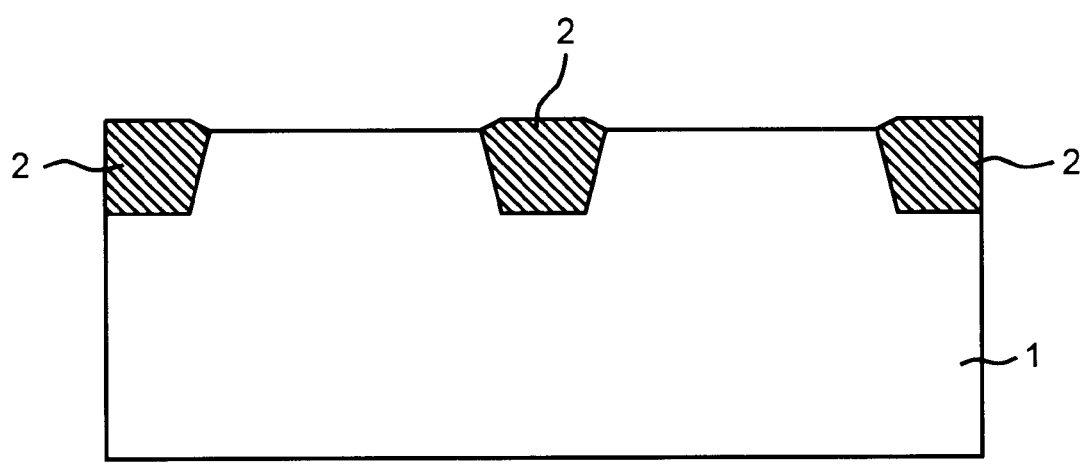

By means of the low-pressure CVD technique, a dielectric film (not shown), such as a silicon oxide film, is formed over the entirety of the wafer to a thickness of about 300 to 800 nm. Subsequently, the silicon oxide film is removed from the surface of the silicon nitride film 32 by means of chemical-and-mechanical polishing (CMP) while the silicon nitride film 32 is taken as a stopper, to thereby leave the silicon oxide film in only the trenches 41 and the openings defined by the silicon nitride film 32. After the silicon nitride film 32 has been removed by means of wet etching making use of a hot phosphoric acid, the silicon oxide film 31 is removed, whereby the isolation dielectric film 2 is formed. FIG. 6 is a cross-sectional view showing the elements of the semiconductor device after the above-described process.

Figure 7:
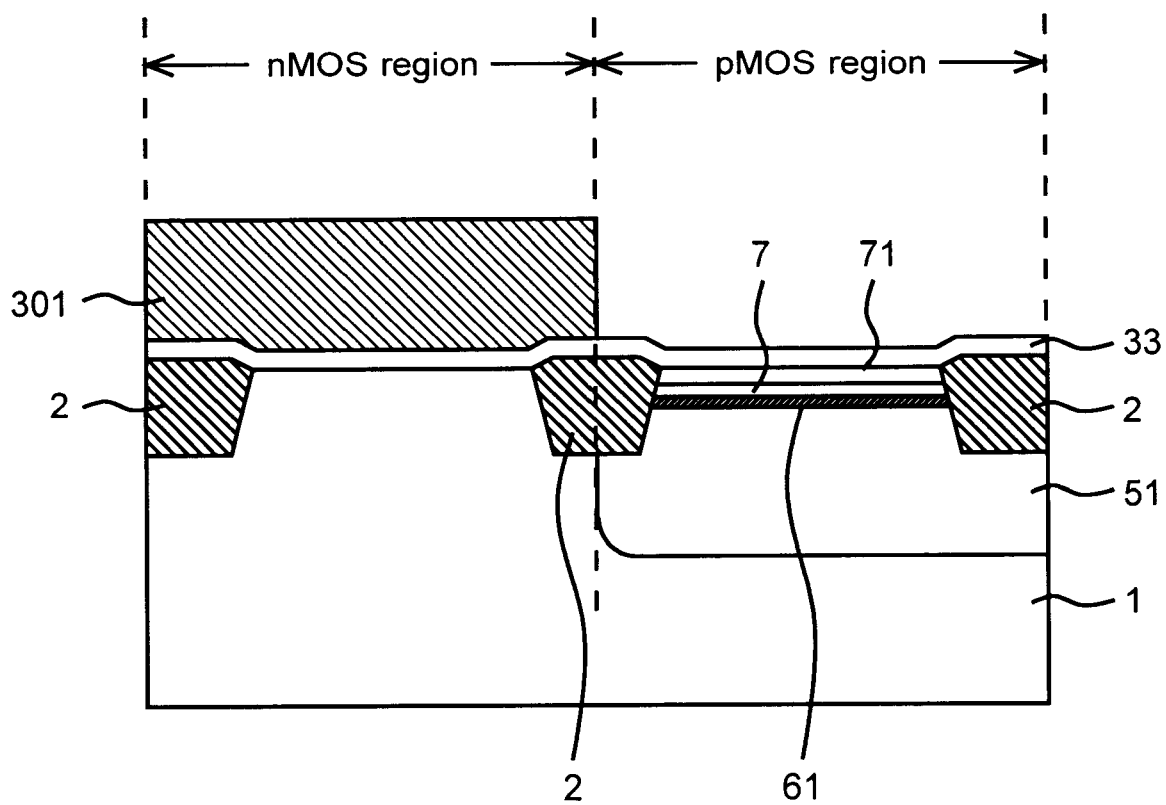

In FIG. 7, reference numeral 301 designates a photoresist mask, and 33 designates a silicon oxide film. As shown in the drawing, the silicon oxide film 33 is formed on the surface of the semiconductor substrate 1 to a thickness of about 30 nm, by means of thermal oxidation. The photoresist mask 301 is formed such that an opening is formed therein so as to correspond to the surface of the pMOS region. The entire surface of the wafer is implanted with n-type impurities, such as phosphorous, to thereby form the n-well 51 within the pMOS region. The entire surface of the wafer is implanted with n-type impurities, such as phosphorous, at 20 KeV or thereabouts and at a dosage of $1\times10^{12}/cm^2$ or more, to thereby form the punch-through stopper layer 61 within the pMOS region. Subsequently, the entire surface of the wafer is implanted with p-type impurities, such as boron or boron fluoride, at 20 KeV or thereabouts and at a dosage of $1\times10^{12}/cm^2$ or more, to thereby form the counter-doped layer 7 within the pMOS region. The entire surface of the wafer is implanted with p-type impurities, such as boron or boron fluoride, at 15 KeV or thereabouts and at a dosage of $1\times10^{12}/cm^2$ or more, to thereby form the counter-doped layer 71 within the pMOS region. The only requirement for causing the peak of doping level of the counter-doped layer 71 to locate on the surface of the semiconductor substrate 1 is that implantation energy be set to 10 KeV or thereabouts. FIG. 7 is a cross-sectional view showing the elements of the semiconductor device after completion of the foregoing process. Subsequently, the photoresist mask 301 is removed.

The counter-doped layer 7 may be formed through ion implantation from an oblique angle while the wafer is rotated (hereinafter referred to simply as "oblique rotation ion implantation"). For example, in a case where the peak of doping level is set on the surface of the semiconductor substrate 1, the silicon oxide film 33 is formed to a thickness of about 20 nm, and the wafer is doped with boron at a doping level of $1\times10^{12}/cm^2$ or more through rotational ion implantation. In a case where a monocrystalne silicon is doped with boron, boron implants fly over a distance of 29.8 nm. Therefore, 29.8 nm×sin 45°=21 nm. Thus, the peak of the doping level can be positioned on the surface of the semiconductor substrate 1. Similarly, even when the peak of doping level of the counter-doped layer 71 is situated within the semiconductor substrate 1, the position of the peak can be set.

The depth of peak of the doping level is changed in accordance with the thickness of a film, such as the silicon oxide film 33, formed on the surface of the semiconductor substrate, and hence ion implantation is controlled, as required.

Figure 8:
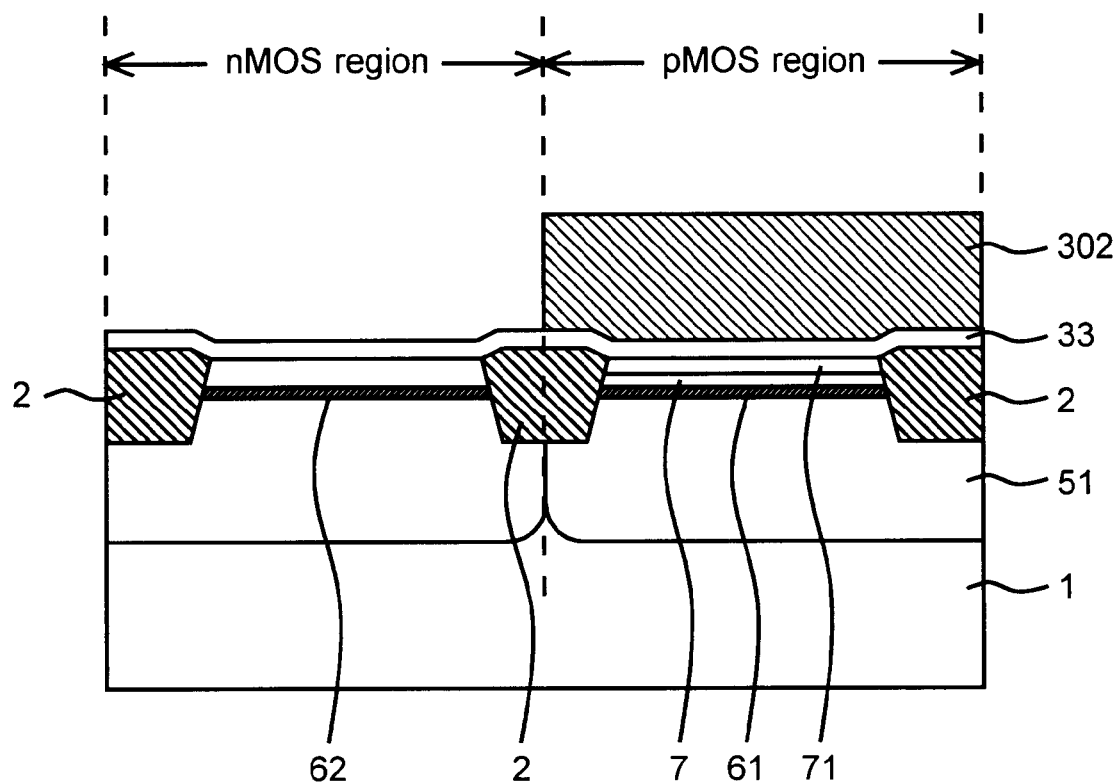

In FIG. 8, reference numeral 302 designates a photoresist mask. As shown in the drawing, the photoresist mask 302 is formed such that an opening is formed therein so as to correspond to the surface of the nMOS region. The entire surface of the wafer is implanted with p-type impurities, such as boron or boron fluoride, to thereby form the p-well 52 within the nMOS region. The entire surface of the wafer is implanted with p-type impurities, such as boron or boron fluoride, at 50 KeV or thereabouts and at a dosage of $1\times10^{12}/cm^2$ or more, to thereby form the punch-through stopper layer 62 within the nMOS region. FIG. 8 is a cross-sectional view showing the elements of the semiconductor device after completion of the foregoing process. Subsequently, the photoresist mask 301 and the silicon oxide film 33 are removed. The silicon oxide film 33 is provided so as to protect the surface of the semiconductor substrate 1 from damage, which would be otherwise be caused by ion implantation.

Figure 9:
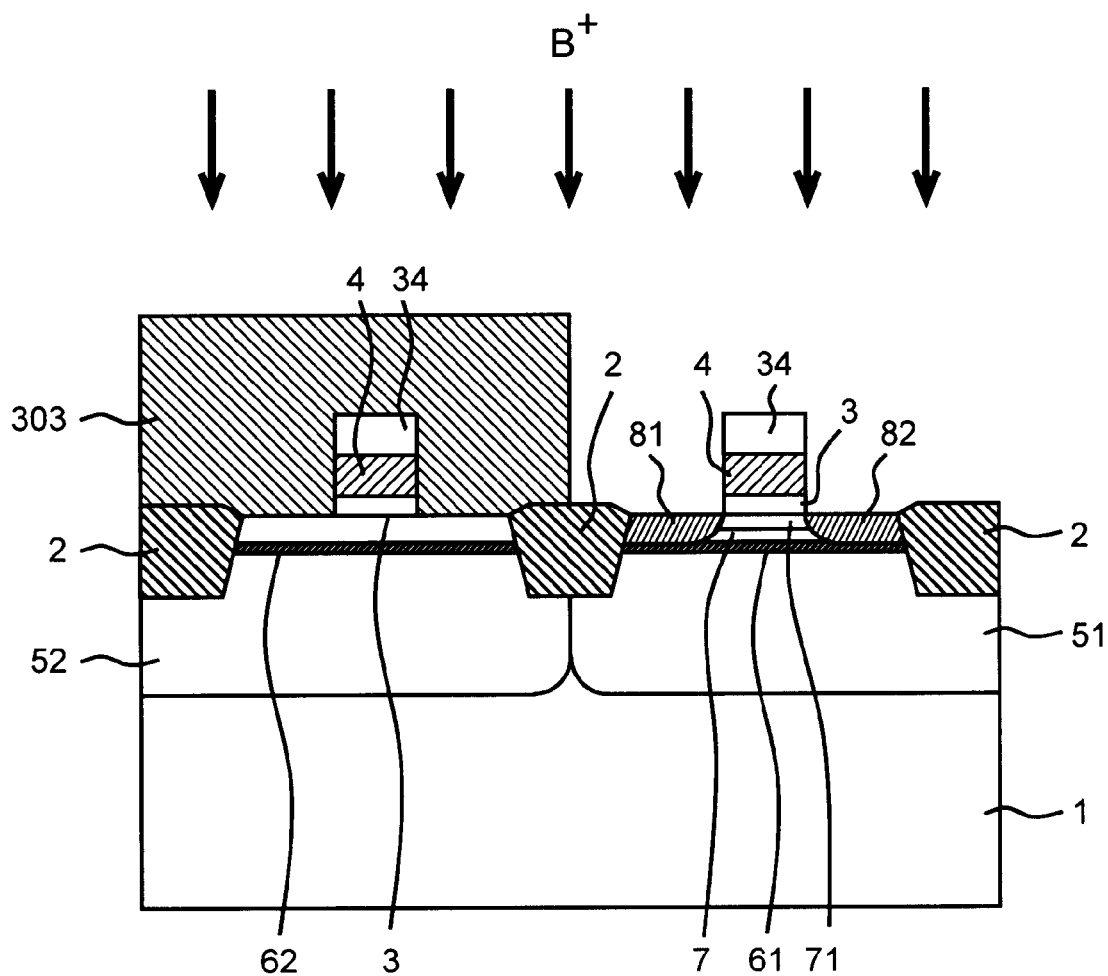

In FIG. 9, reference numeral 34 designates a silicon oxide film, and 303 designates a photoresist mask. As shown in the drawing, a silicon oxide film is formed on the entire surface of the semiconductor substrate 1 to a thickness of about 2 to 15 nm by means of thermal oxidation. By means of the low-pressure CVD technique (LPCVD), a polysilicon layer doped with n-type impurities, such as phosphorous, at a doping level of about $1\times10^{20}/cm^3$ to $5\times10^{20}/cm^3$ is formed over the entire surface of the wafer to a thickness of about 50 to 150 nm. Subsequently, the wafer is patterned by means of anisotropic etching, through use of the silicon oxide film 34 and a photoresist mask (not shown), to thereby form the gate electrode 4. After removal of the photoresist mask, a photoresist mask 303 is newly formed so as to cover the nMOS region, and the entire surface of the wafer is implanted with p-type impurities, such as boron, at 40 KeV and at a dosage of $1\times10^{14}/cm^2$ or thereabouts, to thereby form the source/drain regions 81 and 82. At this time, the silicon oxide film 34 still remains on the surface of the gate electrode 4 doped with n-type impurities, thereby preventing implantation of boron into the inside of the gate electrode 4 and the portion of the semiconductor substrate 1 located beneath the gate electrode 4. FIG. 9 is a cross-sectional view of the elements manufactured in the semiconductor device after completion of the foregoing process.

Subsequently, after removal of the photoresist mask 303, a photoresist mask (not shown) is formed so as to cover the pMOS region. The entire surface of the wafer is implanted with n-type impurities, such as phosphorous or arsenic, at 40 KeV and at a dosage of $1\times10^{14}/cm^2$ or thereabouts, to thereby form the source/drain regions 91 and 92. In a case where the source/drain regions are not formed in an LDD structure, implantation for forming the source/drain regions 81, 82, 91, and 92 is effected at 60 KeV and at a dosage of $5\times10^{14}/cm^2$ or thereabouts. In that case, formation of the source/drain regions 83, 84, 93, and 94 is not performed.

Figure 10:
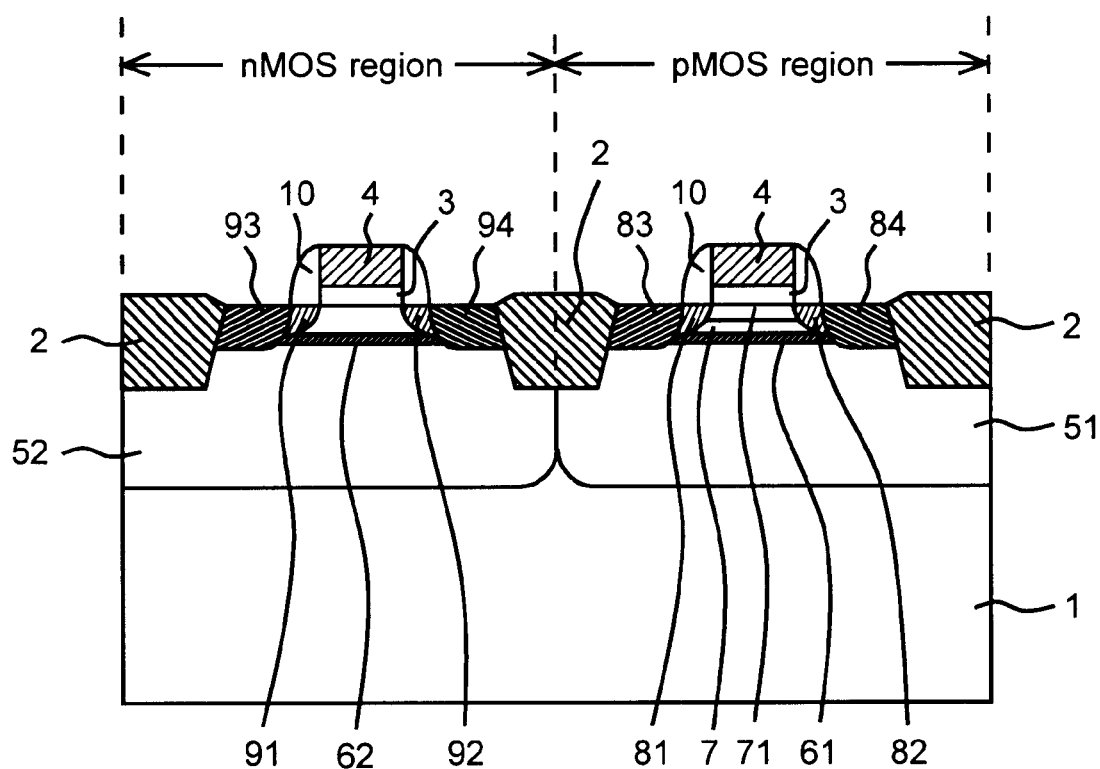

After removal of the photoresist mask and the silicon oxide film 34, a dielectric film, such as a silicon oxide film, is formed over the entire surface of the wafer to a thickness of about 30 to 100 nm, and the wafer is subjected to an etchback process, to thereby form sidewall spacers 10. The pMOS region is implanted with p-type impurities, such as boron, at 100 KeV and a dosage of $1\times10^{15}/cm^2$ or thereabouts through use of a photoresist mask (not shown), to thereby form the source/drain regions 83 and 84. The NMOS region is implanted with n-type impurities, such as phosphorous or arsenic, at 100 KeV and at a dosage of about $1\times10^{15}/cm^2$, to thereby form the source/drain regions 93 and 95. FIG. 10 is a cross-sectional view showing the elements of the semiconductor device after completion of the foregoing process.

The sidewall spacers 10 may be formed from a multilayered film comprising a silicon oxide film and a silicon nitride film. In such a case, after a silicon oxide film has been formed through rapid thermal oxidation (RTO), a silicon nitride film is deposited through CVD and the wafer is subjected to an etchback process, to thereby form the multilayered film.

In some cases, the sequence of ion implantation may be reversed between the nMOS region and the pMOS region.

In a case where a metal silicide layer is formed on the surface of the gate electrode 4 and the surface of the source/drain regions 83, 84, 93, and 94, cobalt is deposited on the entire surface of the wafer in the course of this process, and the wafer is subjected to rapid thermal annealing (RTA). As a result, exposed portions of silicon induce reaction, to thereby form a metal silicide layer. The cobalt which has remained unreacted is removed (not shown).

By means of the low-pressure CVD technique, a silicon oxide film, which is to constitute the interlayer dielectric film 11, is deposited to a thickness of about 200 to 600 nm. The contact hole 15 communicating with the source/drain regions 81 and 83 and the contact hole 15 communicating with the source/drain regions 91 and 93 are opened to a diameter of 0.1 to 0.5 μm by means of dry etching. After the contact holes 15 have been filled with a material for interconnection by means of CVD, the wafer is patterned, thus forming the interconnections 12. Similarly, the interlayer dielectric film 14 is formed, and there are formed the contact hole 151 communicating with the source/drain regions 82 and 84, the contact hole 151 communicating with the source/drain regions 92 and 94, and the interconnections 13. In this way, the semiconductor device 1 such as that shown in FIG. 1 is manufactured.

The present embodiment has described one example of interconnections. The relationship between the contact hole and the interconnection is changed according to the layout of circuitry, and the sequence where the contact holes and the interconnections are formed can be changed, as required. In some cases, interconnections may be formed in an upper layer by way of another interlayer dielectric film, thus constituting multilayer interconnections. The interconnections are formed from impurity-implanted polysilicon or metal. If interconnections are formed of metal, barrier metal, such as TiN, is formed on the interior wall surface of each of the contact holes, thereby preventing diffusion of metal into the source/drain regions.

According to the semiconductor device manufacturing method of the first embodiment, even when a buried channel semiconductor device is miniaturized, there can be formed the counter-doped layer 71 in addition to the counter-doped layer 7 and the punch-through stopper layer 51 for preventing occurrence of a punch-through phenomenon along the area between the bottoms of the source/drain regions 83 and 84. Accordingly, a punch-through phenomenon is prevented from occurring in the counter-doped layer 7, thereby yielding an advantage of producing a semiconductor device whose threshold voltage is prevented from being increased.

Further, a steep p-n junction can be formed along the boundary surface between the punch-through stopper layer 61 and the buried-channel counter-doped layer 7, thereby preventing a punch-through phenomenon, which would otherwise be caused by extension of a depletion layer in the p-n junction.

Since the peak of doping level of the counter-doped layer 71 can be positioned on the surface of the semiconductor substrate 1, there can be produced a semiconductor device of improved performance.

The method of manufacturing a semiconductor device according to the first embodiment as described above may be summarized as follows. In the method, an isolation dielectric film (isolation oxide film 2) is formed on the primary surface of a semiconductor substrate (semiconductor substrate 1). A semiconductor region of first conductivity type (n-well 51) is formed in an area on the primary surface of the semiconductor substrate surrounded by the isolation dielectric film. A first impurity region of first conductivity type (punch-through stopper layer 61) having a first concentration peak is formed within the semiconductor region in the vicinity of the primary surface thereof. A second impurity region of second conductivity type (counter-doped layer 7), which has a second concentration peak at a position shallower than that of the first concentration peak, is formed within the semiconductor region in the vicinity of the primary surface thereof, and overlaps the first impurity region with respect to a depthwise direction of the semiconductor substrate. A third impurity region of second conductivity type (counter-doped layer 71), which has a third concentration peak at a position shallower than that of the second concentration peak, is formed within the semiconductor region in the vicinity of the primary surface thereof, and overlaps the first and second impurity regions with respect to the depthwise direction of the semiconductor substrate. A gate electrode of first conductivity type (gate electrode 4) is formed at a position on the primary surface of the semiconductor region where an overlap exists between the first to third impurity regions with respect to the depthwise direction of the semiconductor substrate. Further, source/drain regions of second conductivity type (source/drain regions 81–84) are formed so as to be spaced a predetermined distance away in the primary surface of the semiconductor region.

Second Embodiment

Figure 11:
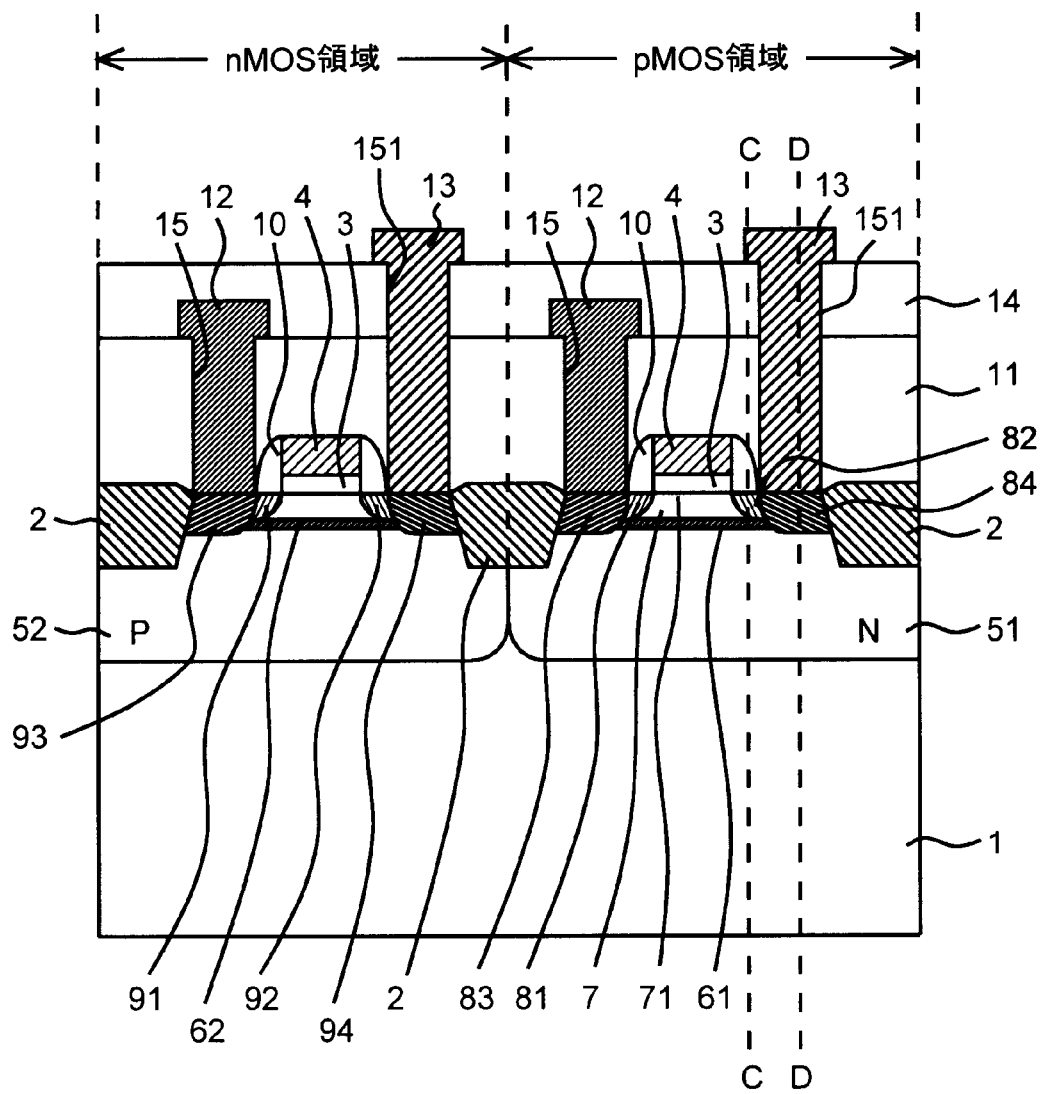
FIG. 11 is a cross-sectional view showing a semiconductor device according to a second embodiment of the present invention.

FIG. 11 is a cross-sectional view showing a semiconductor device according to a second embodiment of the present invention. As shown in the drawing, the source/drain regions 81 and 82 within the pMOS region are formed to be shallower than the counter-doped layer 7. The semiconductor device of the second embodiment is identical in structure with that described in connection with the first embodiment, except that the counter-doped layer 71 is not formed in the semiconductor device of the second embodiment.

Figure 12:
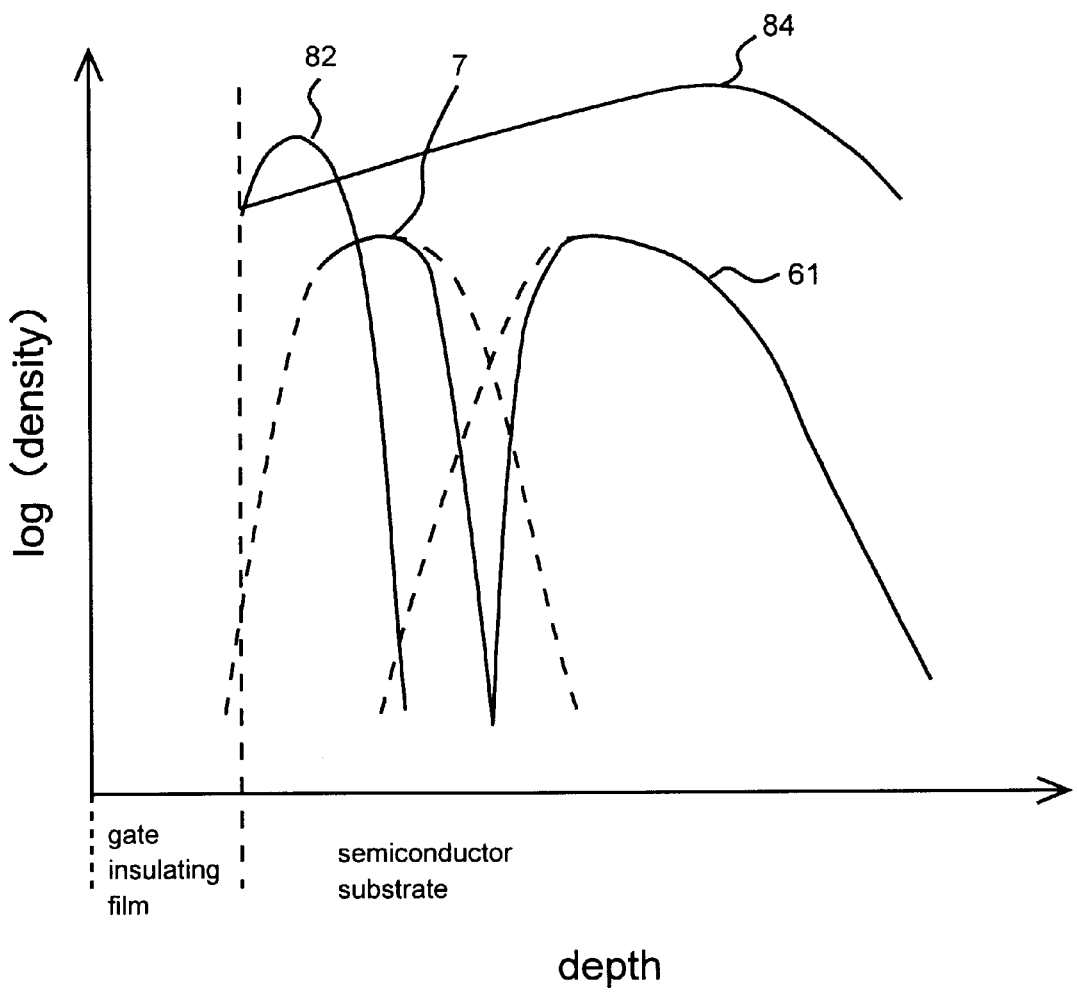
FIG. 12 is a graph showing a distribution of doping levels of the semiconductor device shown in FIG. 11.

FIG. 12 is a graph showing the distribution of doping levels of the semiconductor device of the present invention, including the doping level of the counter-doped layer 7 taken along line C—C shown in FIG. 11, the doping level of the source/drain region 82, the doping level of the punch-through stopper layer 61, and the doping level of the source/drain region 84 taken along line D—D shown in FIG. 11. The peak of the doping level of the counter-doped layer 7 appears at a depth of about 30 nm with reference to the surface of the semiconductor substrate 1. The peak of the doping level of the source/drain region 82 appears at a depth of about 20 nm with reference to the surface of the semiconductor substrate 1. The locations of peaks of the doping levels vary according to the depths to which the source/drain regions 83 and 84 are formed. The shallower the depths of formation of the source/drain regions 83 and 84, the shallower the peaks of doping levels of the source/drain regions 81 and 82 and the counter-doped layer 7.

In a case where metal, such as tungsten, is used as the material of the gate electrode 4 in order to reduce the resistance of the gate electrode 4, the threshold voltage of the nMOS region and the threshold voltage of the pMOS region are increased. Therefore, in such a case, as in the case of the first embodiment, both the NMOS transistor and the PMOS transistor are formed so as to assume a buried-channel structure.

In the semiconductor device of the second embodiment, the punch-through stopper layer 61 prevents occurrence of a punch-through phenomenon at a position between the bottoms of the source/drain regions 83 and 84. The source/drain regions 81 and 82 are formed at a position shallower than that of the counter-doped layer 7. Accordingly, occurrence of a punch-through phenomenon at a position between the bottoms of the source/drain regions 81 and 82 is also prevented, thereby yielding an advantage of an improvement in punch-through resistance of the pMOS device without involvement of an increase in the threshold voltage thereof.

Figure 13:
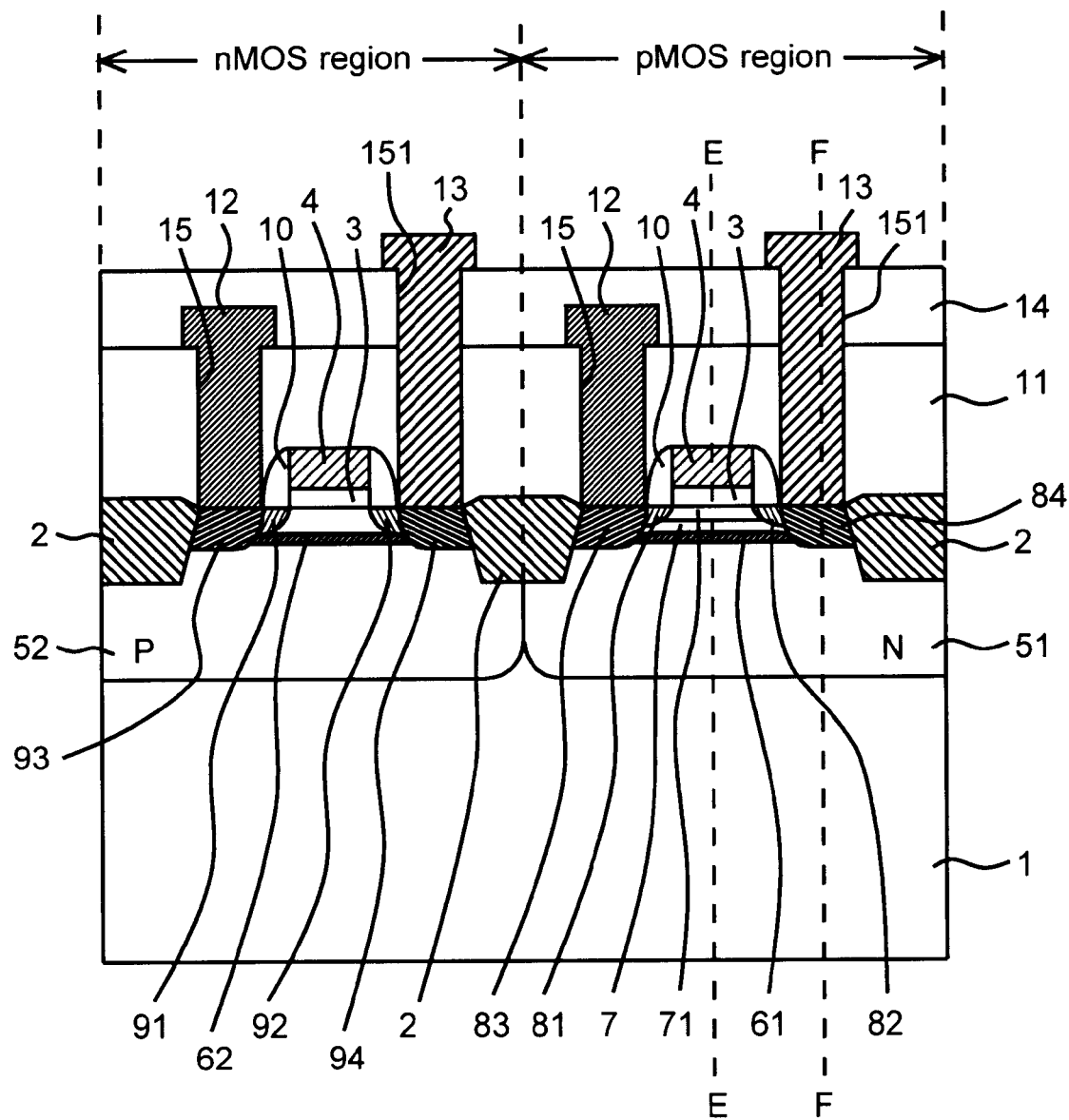
FIG. 13 is a cross-sectional view showing another semiconductor device of the second embodiment.

FIG. 13 is a cross-sectional view showing another semiconductor device of the second embodiment. The semiconductor device of this modification of the second embodiment is characterized by further comprising the counter-doped layer 71, as in the case of the semiconductor device of the first embodiment.

Figure 14:
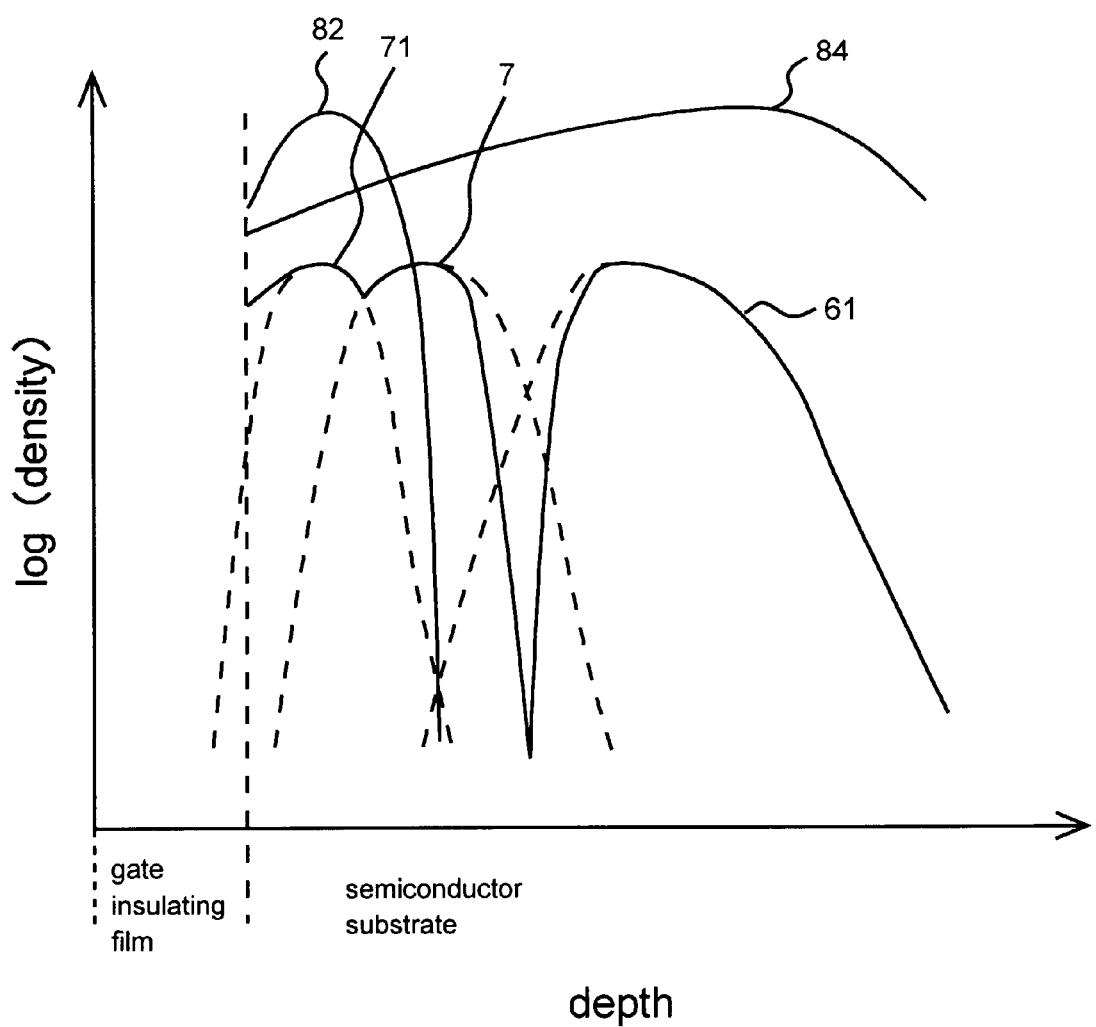
FIG. 14 is a graph showing a distribution of doping levels of the semiconductor device shown in FIG. 13.

FIG. 14 is a graph showing the distribution of doping levels of the semiconductor device according to the present invention, including the doping levels of the counter-doped layers 7 and 71 taken along line E—E shown in FIG. 13, the doping level of the source/drain region 82, the doping level of the punch-through stopper layer 61, and the doping level of the source/drain region 84 taken along line F—F shown in FIG. 13. The peak of the doping level of the counter-doped layer 71 appears at a depth of about 10 nm with reference to the surface of the semiconductor substrate 1, as in the case of the first embodiment. The peak of the doping level of the source/drain region 82 appears at a depth of about 20 nm with reference to the surface of the semiconductor substrate 1. The locations of peaks of the doping levels vary according to the depths to which the source/drain regions 83 and 84 are formed. Further, as in the case of the first embodiment, the peak of doping level of the counter-doped layer 71 may appear on the surface of the semiconductor substrate 1.

The semiconductor device according to the modification of the second embodiment comprises the punch-through stopper layer 61, with the source/drain regions 81 and 82 being formed at a position shallower than that of the counter-doped layer 7. In addition to the advantage of an improvement in the punch-through resistance of the pMOS device, there can be yielded an advantage of provision of a semiconductor device whose gate electrode exhibits good controllability and which exhibits high performance, both effects being due to the counter-doped layer 71 formed on the surface of the semiconductor substrate 1.

In a case where the peak of doping level of the counter-doped layer 71 appears at a position on the surface of the semiconductor substrate 1, it goes without saying that the performance of a semiconductor device and the controllability of the gate electrode are improved to a much greater extent than otherwise.

The semiconductor device according to the second embodiment as described above maybe summarized as follows. The semiconductor device comprises a semiconductor region of first conductivity type (n-well 51) formed on the primary surface of a semiconductor substrate (semiconductor substrate 1) and surrounded by an isolation dielectric film (isolation oxide film 2). First source/drain regions of second conductivity type (source/drain regions 83,84) are formed on the primary surface of the semiconductor region so as to be separated a predetermined distance away from each other. A gate electrode of first conductivity type (gate electrode 4) is formed on the primary surface of the semiconductor region with a gate insulation film interposed therebetween, so as to face a region sandwiched between the source region and the drain region. A first impurity region of first conductivity type (punch-through stopper layer 61) is formed in a portion of the semiconductor region sandwiched between the source region and the drain region in the vicinity of the primary surface of the semiconductor region, and has a first concentration peak. A second impurity region of second conductivity type (counter-doped layer 7) is formed within the region and in the vicinity of the primary surface of the semiconductor region, and has a second concentration peak located at a position shallower than the position of the first concentration peak. Further, second source/drain region of second conductivity type (81,82) are formed on the primary surface of the area of the semiconductor region sandwiched between the first source region and the first drain region, within the region and in the vicinity of the primary surface of the semiconductor region, so as to be separated a predetermined distance apart from each other, and have a concentration peak at a position shallower than that of the second impurity concentration peak.

Figure 15:
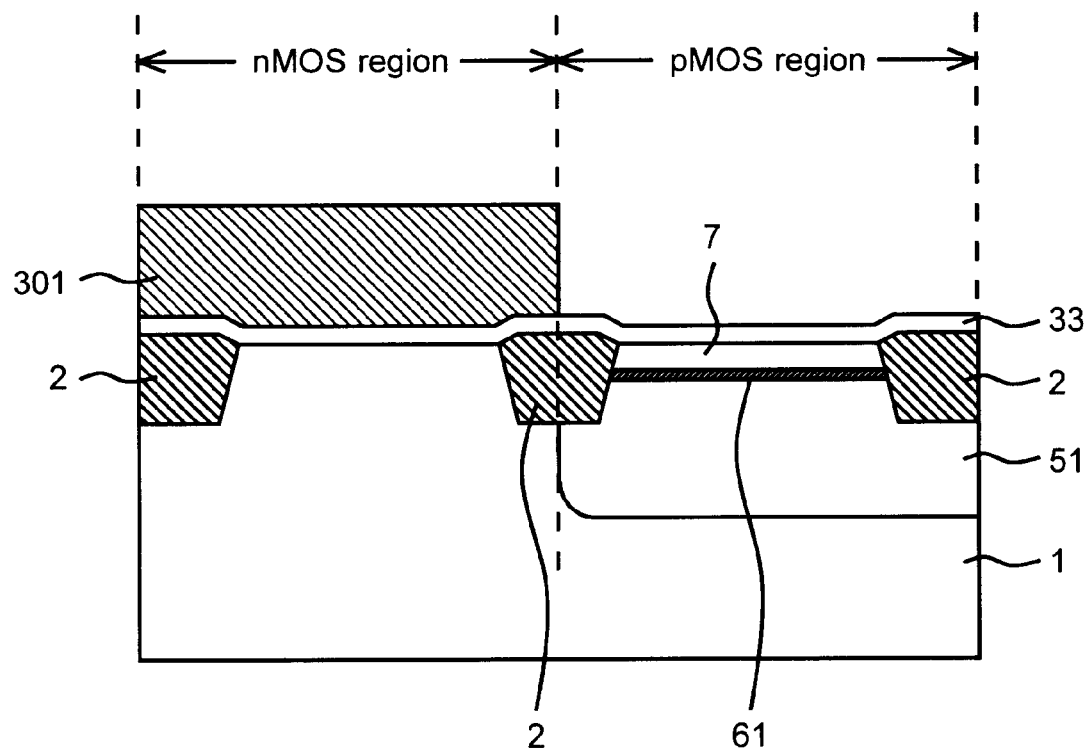
FIGS. 15 and 16 are cross-sectional views showing a process of manufacturing a semiconductor device of the second embodiment in the present invention.
Figure 16:
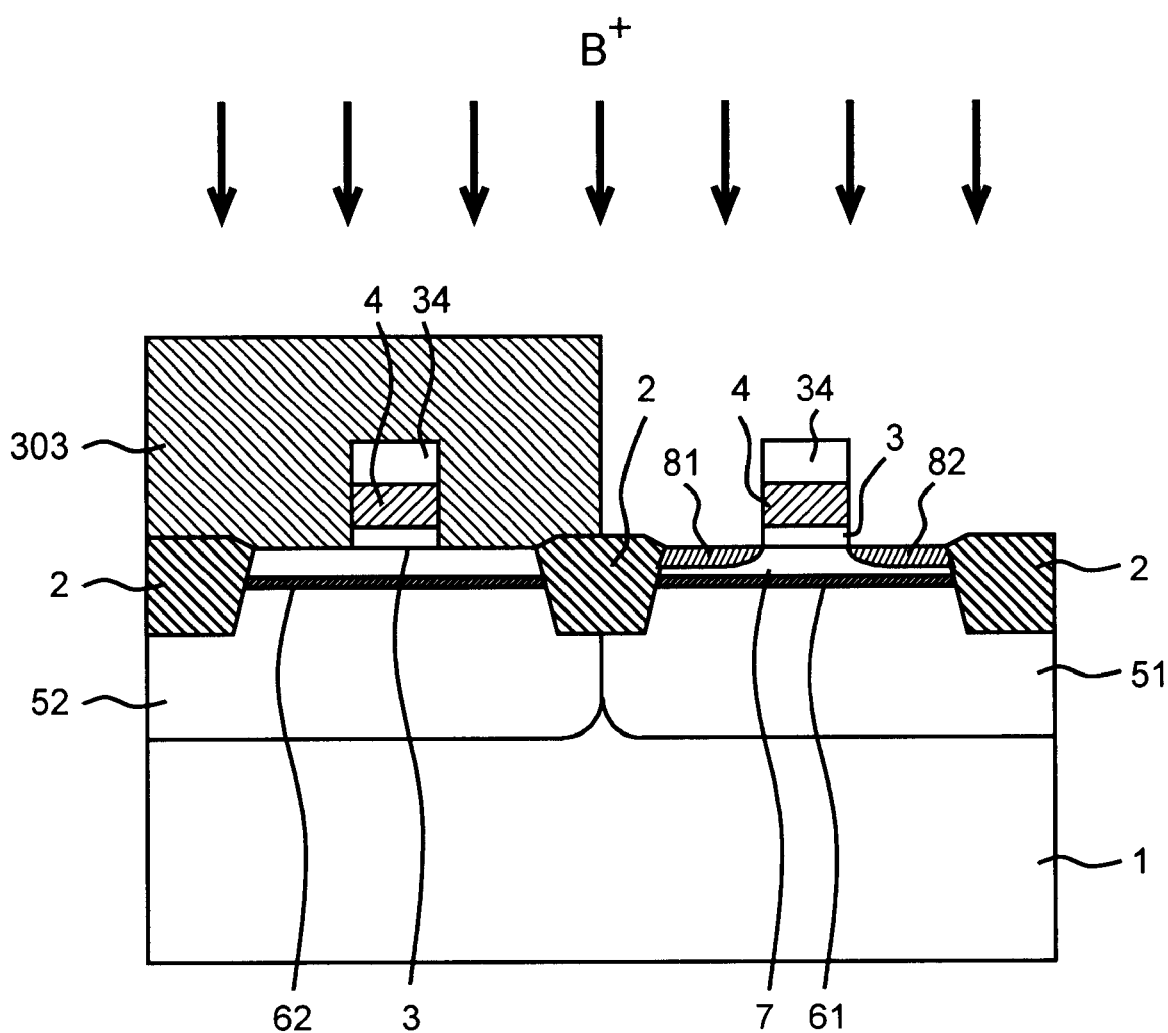

A method of manufacturing the semiconductor device of the second embodiment will now be described. FIGS. 15 and 16 are cross-sectional views showing a process of manufacturing the semiconductor device of the second embodiment.

As in the case of the first embodiment, after formation of the isolation dielectric film 2, there is formed a photoresist mask (not shown) such that an opening is formed in the photoresist mask so as to correspond to the surface of the PMOS region, to thereby form the n-well 51 and the punch-through stopper layer 61. Subsequently, the entire surface of the wafer is implanted with p-type impurities, such as boron or boron fluoride, at 20 KeV or thereabouts and at a dosage of $1\times10^{12}/cm^2$ or more, to thereby form the counter-doped layer 7 within the pMOS region. The photoresist mask is then removed. FIG. 15 is a cross-sectional view showing the elements of the semiconductor device after completion of the foregoing process. In a case where the counter-doped layer 71 is to be formed in the pMOS, the wafer is subjected to ion implantation, in the course of this phase, under the same conditions as employed in the first embodiment (not shown) region. Ion implantation may be effected at low energy or by means of oblique rotation ion implantation. Further, the peak of doping level may be set so as to appear on the surface of the semiconductor substrate 1.

As in the case of the first embodiment, after formation of the p-well 52, the punch-through stopper layer 62, and the gate electrode 4, a photoresist mask 303 is formed so as to cover the nMOS region. The entire surface of the wafer is implanted with p-type impurities, such as boron, at 10 KeV and at a dosage of $1\times10^{14}/cm^2$ or thereabouts, to thereby form the source/drain regions 81 and 82. At this time, the silicon oxide film 34 still remains on the surface of the gate electrode 4 which is doped with n-type impurities, thereby preventing doping of boron into the inside of the gate electrode 4 and the portion of the semiconductor substrate 1 located below the gate electrode 4. FIG. 16 is a cross-sectional view showing the elements of the semiconductor device after completion of the foregoing process. Subsequently, as in the case of the first embodiment, the source/drain regions 91 and 92, the sidewall spacers 10, the source/drain regions 83 and 84, and the source/drain regions 93 and 94 are formed. As in the case of the first embodiment, the sidewall spacers 10 may be formed from a multilayered film comprising a silicon oxide film and a silicon nitride film.

As in the case of the first embodiment, the sequence of ion implantation may be reversed between the nMOS region and the pMOS region. A metal silicide layer may be formed on the surface of the gate electrode 4, the surface of the source/drain regions 83 and 84, and the surface of the source/drain regions 93 and 94, as required.

As in the case of the first embodiment, the interlayer dielectric film 11, the contact holes 15, the interconnections 12, the interlayer dielectric film 14, the contact holes 151, and the interconnections 13 are formed. In this way, the semiconductor device shown in FIG. 11 is manufactured.

The method of manufacturing the semiconductor device of the second embodiment enables formation of the punch-through stopper layer 61. Occurrence of a punch-through phenomenon at a position between the bottoms of the source/drain regions 83 and 84 is prevented, and the source/drain regions 81 and 82 can be formed at a position shallower than that of the counter-doped layer 7. Accordingly, occurrence of a punch-through phenomenon at a position between the bottoms of the source/drain regions 81 and 82 is prevented. Thus, the method yields an advantage of provision of a method of manufacturing a semiconductor device which prevents an increase in threshold voltage and has improved in punch-through characteristics or resistance.

Further, the counter-doped layer 71 can be formed in the pMOS region, and hence there can be produced a semiconductor device whose gate electrode exhibits good controllability and which has improved performance.

The method of manufacturing a semiconductor device according to the second embodiment as described above may be summarized as follows.

In the method, a first impurity region of first conductivity type (punch-through stopper layer 61) having a first concentration peak is formed within the semiconductor region in the vicinity of the primary surface thereof. A second impurity region of second conductivity type (counter-doped layer 7), which has a second concentration peak at a position shallower than that of the first concentration peak, is formed within the semiconductor region in the vicinity of the primary surface thereof, and overlaps the first impurity region with respect to a depthwise direction of the semiconductor substrate (semiconductor substrate 1). A gate electrode of first conductivity type (gate electrode 4) is formed at a position on the primary surface of the semiconductor region where an overlap exists between the first to third impurity regions with respect to the depthwise direction of the semiconductor substrate. First source/drain regions of first conductivity type (source/drain regions 81,82) are formed so as to be spaced a predetermined distance away from the primary surface of the semiconductor region, and has a concentration peak at a position shallower than that of the second concentration peak within the semiconductor region in the vicinity of the primary surface thereof. Further, second source/drain regions of second conductivity type (source/drain regions 83,84) are formed so as to be spaced a predetermined distance away in the primary surface of the semiconductor region, and has a concentration peak at a position deeper than that of the first concentration peak within the semiconductor region in the vicinity of the primary surface thereof.

Third Embodiment

Figure 17:
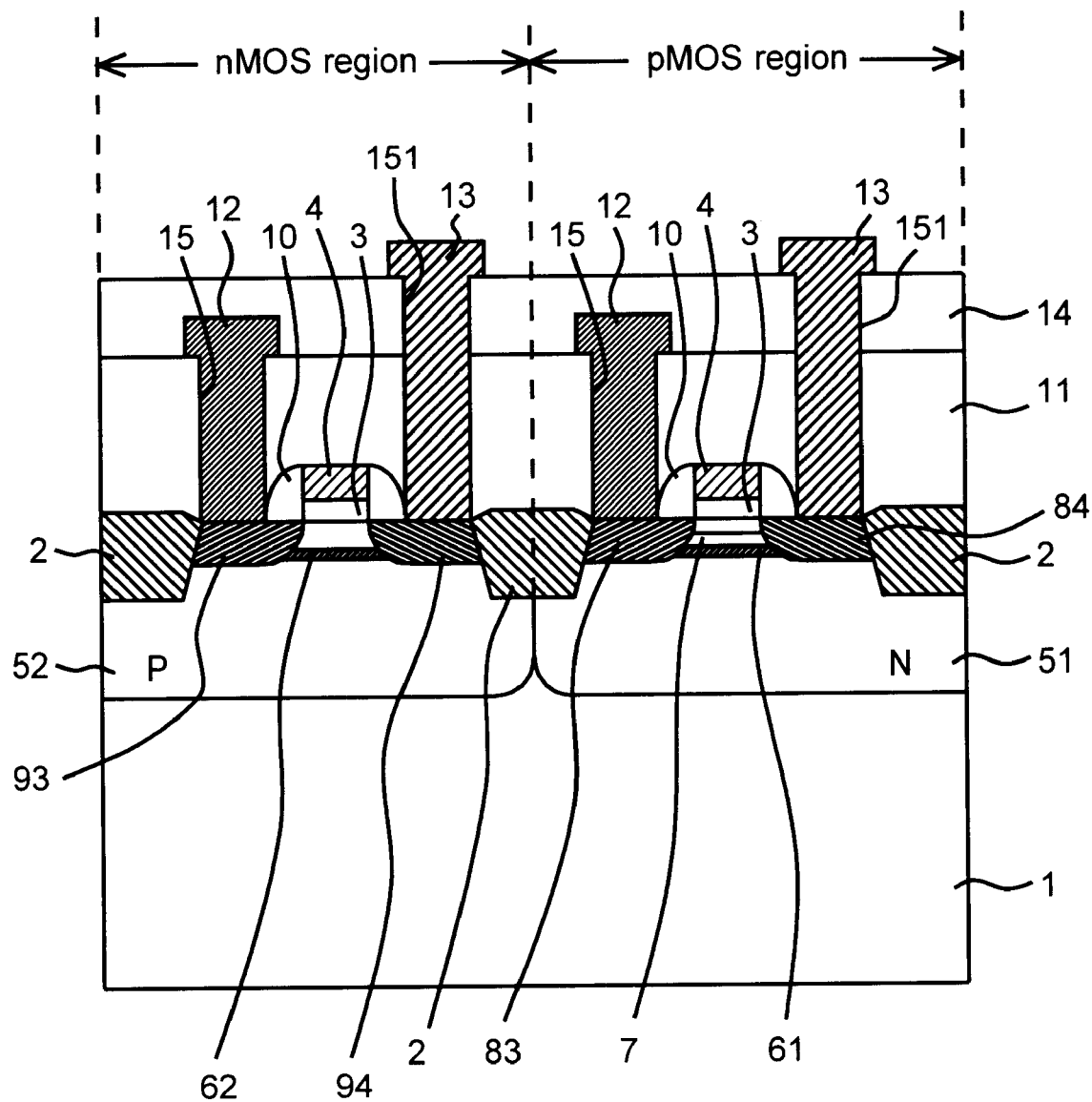
FIG. 17 is a cross-sectional view showing a semiconductor device according to a third embodiment of the present invention.
Figure 18:
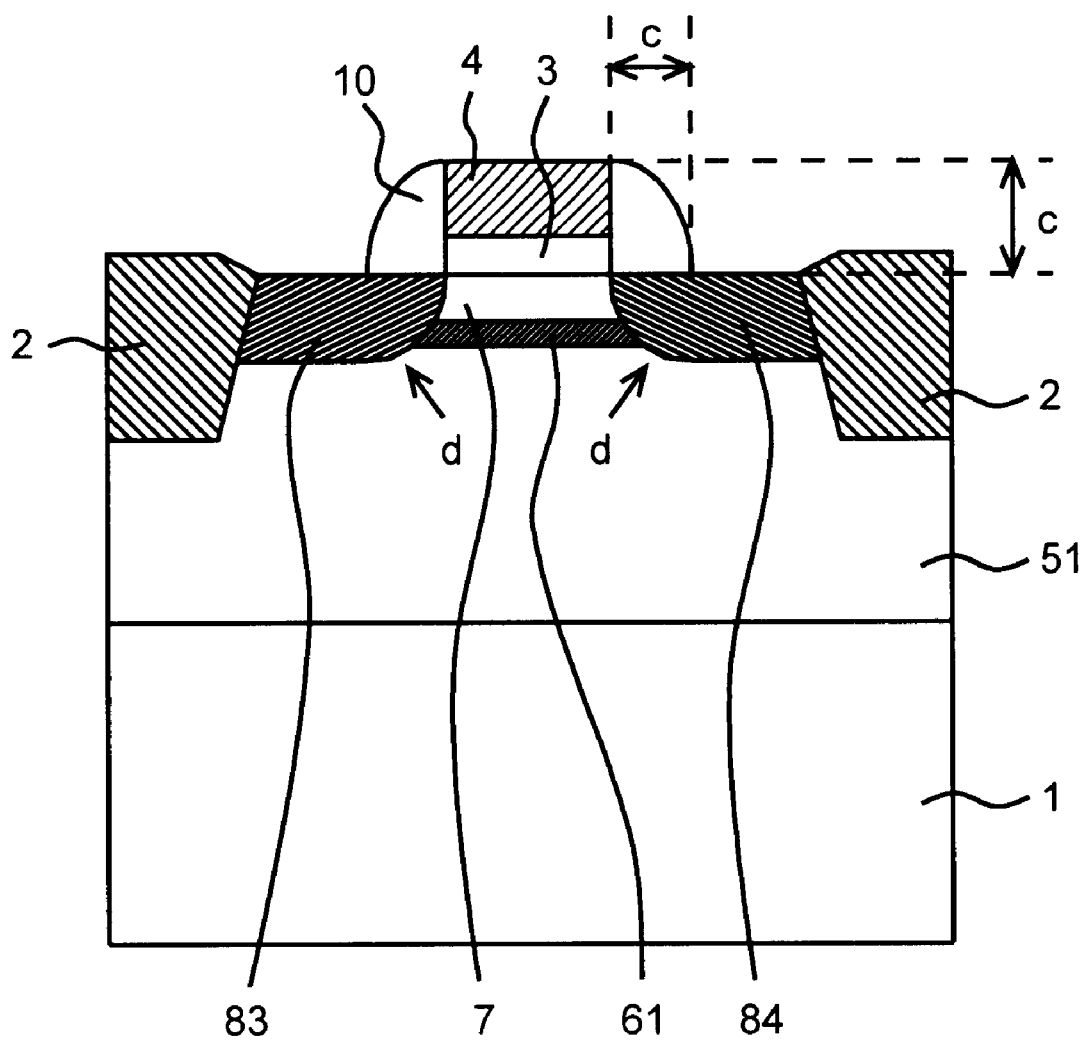
FIG. 18 is an enlarged cross-sectional view of a pMOS region formed in the semiconductor device of the third embodiment shown in FIG. 17.

FIG. 17 is a cross-sectional view showing a semiconductor device according to a third embodiment of the present invention. Each of the sidewall spacers 10 is formed so as to become equal in thickness and height. FIG. 18 is an enlarged cross-sectional view of a PMOS region formed in the semiconductor device of the third embodiment shown in FIG. 17. As can be seen from the drawing, the sidewall spacers 10 are formed so as to become equal in thickness and height (denoted by "c" in the drawing). After formation of the sidewall spacers 10, the source/drain regions 83 and 84 are formed in a self-aligned manner. The semiconductor device of the present embodiment is identical in structure with that of the first embodiment, except that the counter-doped layer 71 and the source/drain regions 81 and 82 are not formed in the semiconductor device of the third embodiment. Although not shown in the drawings, the third embodiment may be applied to the semiconductor device of the first or second embodiment.

In the semiconductor device of the third embodiment, the source/drain regions 83 and 84, which are formed in a self-aligned manner through use of the sidewall spacers 10, which are of equal height and thickness, are formed such that the lower ends of the source/drain regions 83 and 84 (denoted by points "d" in the drawing), where the highest electric field develops, are spaced away from each other, thereby yielding an advantage of an improvement in the punch-through resistance of the semiconductor device.

The semiconductor device according to the third embodiment as described above may be summarized as follows. The semiconductor device comprises a semiconductor region of first conductivity type (n-well 51) formed on the primary surface of a semiconductor substrate (semiconductor substrate 1) and surrounded by an isolation dielectric film (isolation oxide film 2). Source/drain regions of second conductivity type (source/drain regions 83,84) are formed on the primary surface of the semiconductor region so as to be separated a predetermined distance away from each other. A gate electrode of first conductivity type (gate electrode 4) is formed on the primary surface of the semiconductor region with a gate insulation film interposed therebetween, so as to face a region sandwiched between the source region and the drain region. A first impurity region of first conductivity type (punch-through stopper layer 61) is formed in the region sandwiched between the source region and the drain region and in the vicinity of the primary surface of the semiconductor region, and has a first concentration peak. A second impurity region of second conductivity type (counter-doped layer 7) is formed in the vicinity of the primary surface of the semiconductor region, and has a second concentration peak at a position shallower than the position of the first concentration peak. Further, sidewall spacers (sidewall spacers 10) are formed on the side surface of the gate electrode and have substantially the same dimension in both thickness and height relative to the semiconductor substrate.

Figure 19:
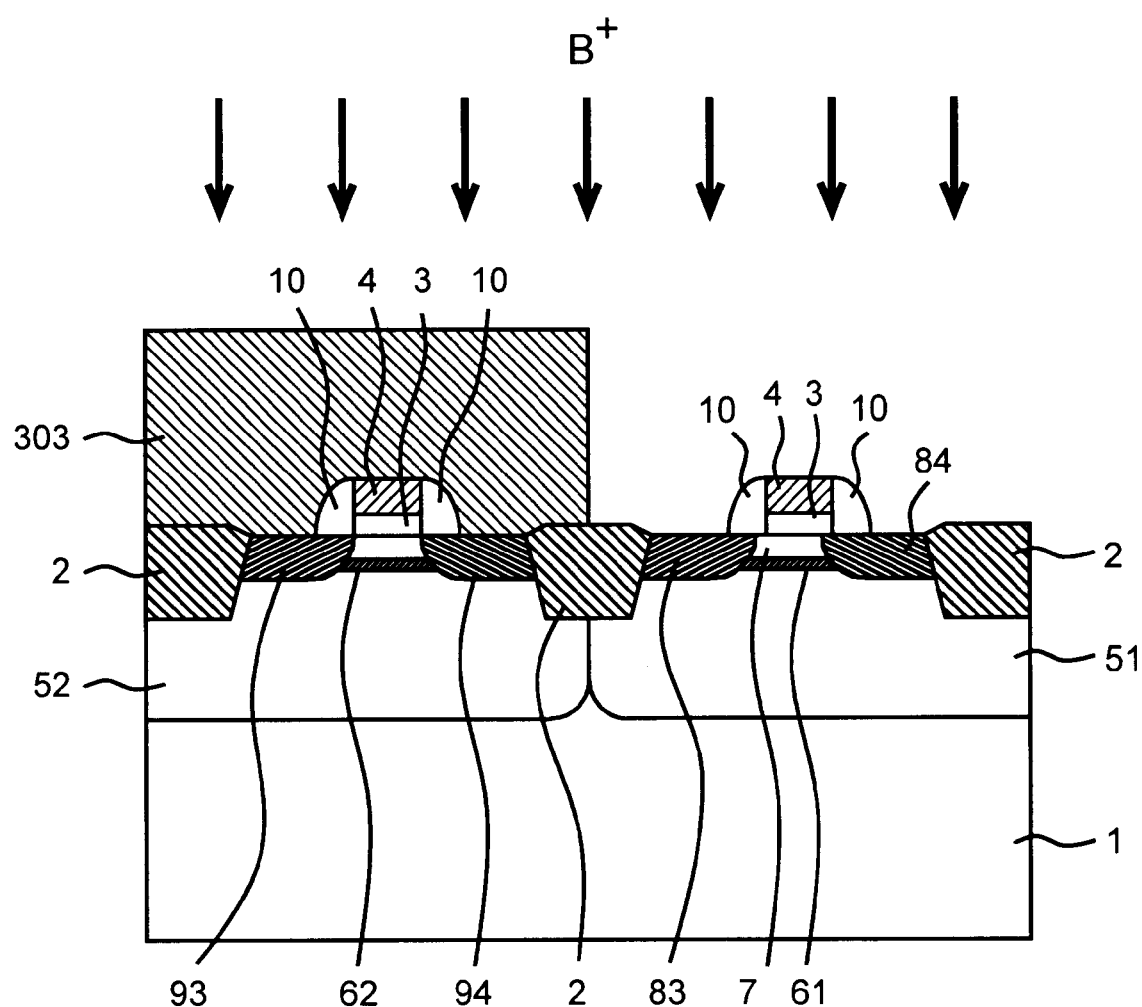
FIG. 19 is a cross-sectional view showing a process of manufacturing the semiconductor device of the third embodiment.
Figure 20:
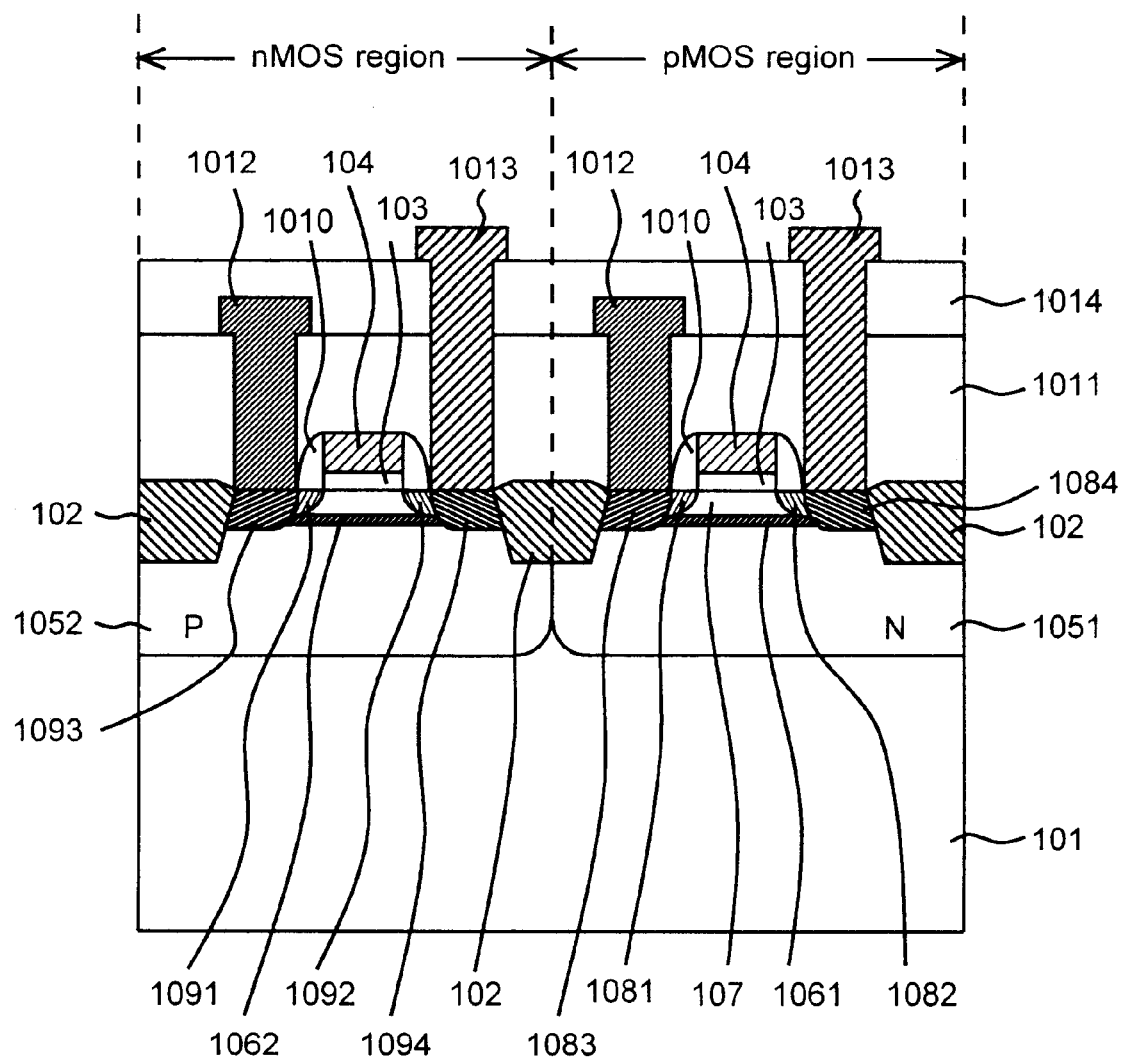
FIG. 20 is a cross-sectional view showing a conventional semiconductor device.
Figure 21:
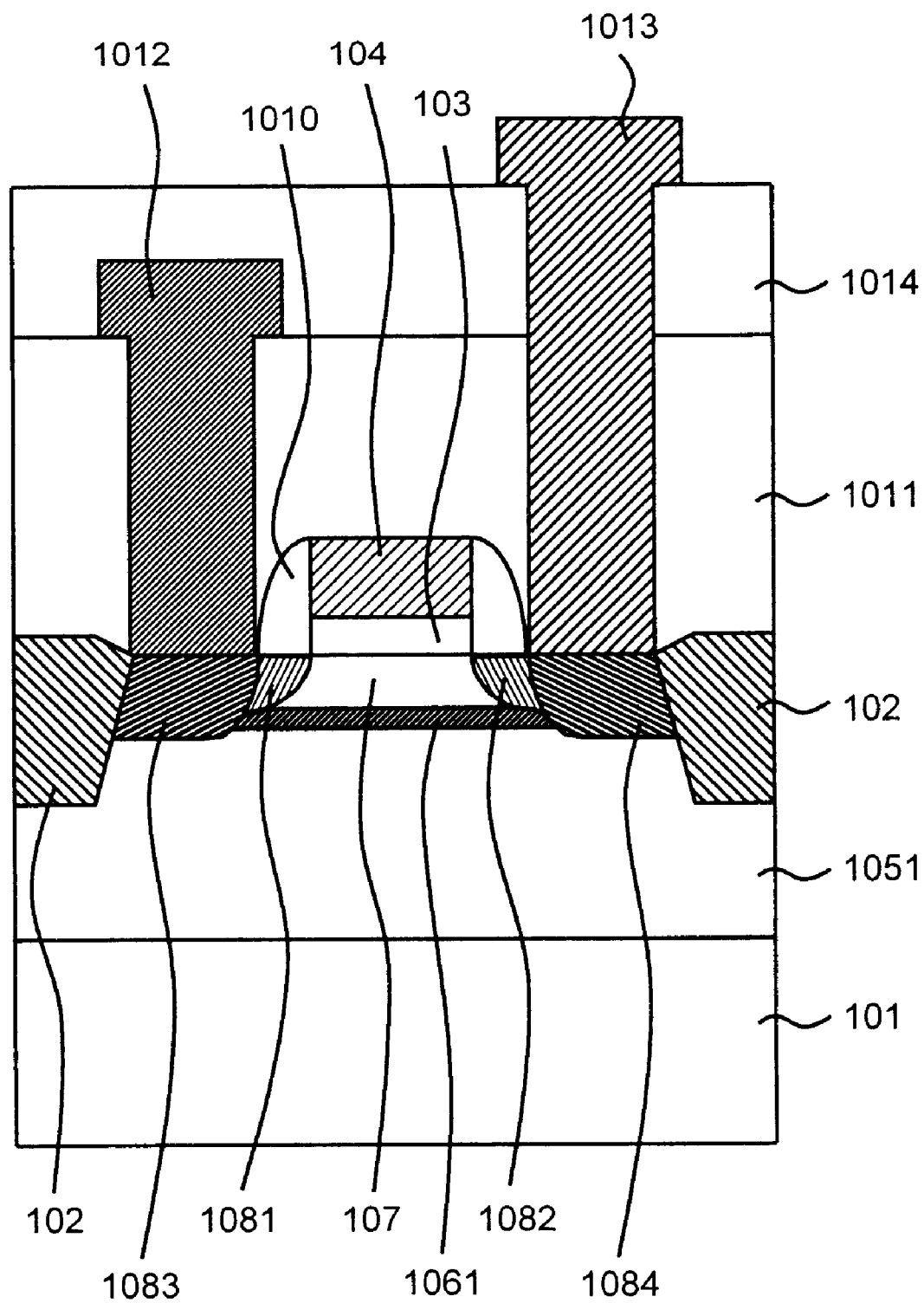
FIG. 21 is an enlarged cross-sectional view of a pMOS region formed in the conventional semiconductor device in FIG. 20.

FIG. 19 is a cross-sectional view showing a process of manufacturing the semiconductor device of the third embodiment.

As in the case of the first embodiment, after the isolation dielectric film 2, the n-well 51, the punch-through stopper layer 61, the counter-doped layer 7, the p-well 52, the punch-through layer 62, the gate dielectric film 3, and the gate electrode 4 have been formed on the surface of the semiconductor substrate 1, the entire surface of the wafer is subjected to CVD, to thereby form a dielectric film, such as a silicon oxide film, to a thickness of about 30 to 100 nm. The wafer is then subjected to etchback by means of anisotropic etching, to thereby form the sidewall spacers 10.

As in the case of the first embodiment, the pMOS region is doped with p-type impurities, such as boron, at 100 KeV and a doping level of $1 \times 10^{15}/cm^2$ or thereabouts, to thereby form the source/drain regions 83 and 84. The nMOS region is doped with n-type impurities, such as phosphorous or arsenic, at 100 KeV and a doping level of $1 \times 10^{15}/cm^2$ or thereabouts, to thereby form the source/drain regions 93 and 94. FIG. 19 is a cross-sectional view showing the elements of the semiconductor device after completion of the foregoing process.

Subsequently, as shown in FIG. 17, the interlayer dielectric film 11, the contact holes 15, the interconnections 12, the interlayer dielectric film 14, the contact holes 151, and the interconnections 13 are formed as in the first embodiment. In this way, the semiconductor device shown in FIG. 17 is manufactured.

As in the case of the first embodiment, a metal silicide layer may be formed on the surface of the gate electrode 4, the surfaces of the source/drain regions 83 and 84, and the surface of the source/drain regions 93 and 94. Alternatively, the semiconductor device may be formed into an LDD structure by means of additionally forming the source/drain regions 81 and 82 and the source/drain regions 91 and 92 similarly with the first embodiment.

According to the method of manufacturing a semiconductor device of the third embodiment, the sidewall spacers 10 which are of equal height and thickness can be formed in a self-aligned manner by means of anisotropic etching. Further, the source/drain regions 83 and 84, which are formed in a self-aligned manner through use of the sidewall spacers 10 of equal height and thickness, are formed such that the lower ends of the source/drain regions 83 and 84 (denoted by points "d" in FIG. 18), where the highest electric field develops, are spaced away from each other, thereby yielding an advantage of an improvement in the punch-through characteristics of the semiconductor device.

The method of manufacturing a semiconductor device according to the third embodiment as described above may be summarized as follows. In the method, an isolation dielectric film (isolation oxide film 2) is formed on the primary surface of a semiconductor substrate (semiconductor substrate 1). A semiconductor region of first conductivity type (n-well 51) is formed in an area on the primary surface of the semiconductor substrate surrounded by the isolation dielectric film. A first impurity region of first conductivity type (punch-through stopper layer 61) having a first concentration peak is formed within the semiconductor region in the vicinity of the primary surface thereof. A second impurity region of second conductivity type (counter-doped layer 7), which has a second concentration peak at a position shallower than that of the first concentration peak, is formed within the semiconductor region in the vicinity of the primary surface thereof, and overlaps the first impurity region with respect to a depthwise direction of the semiconductor substrate. A gate electrode of first conductivity type (gate electrode 4) is formed at a position on the primary surface of the semiconductor region where an overlap exists between the first and second impurity regions with respect to the depthwise direction of the semiconductor substrate. Sidewall spacers (sidewall spacers 10) are formed on the side walls of the gate electrode by means of forming an insulation film over the entire surface of the gate electrode and by means of etchback performed through anisotropic etching. Further, source/drain regions (source/drain regions 83,84) are formed so as to be spaced a predetermined distance away in the primary surface of the semiconductor region, by means of implanting the entire surface of the semiconductor substrate with impurities of second conductivity type.

The features and advantages of the present invention as described above may be summarized as follows.

In the semiconductor device having a buried-channel structure of the present invention, even when a semiconductor element is miniaturized, a punch-through stopper layer prevents occurrence of a punch-through phenomenon at a position between the bottoms of source/drain regions. Further, since a counter-doped layer is formed from two layers, there can be yielded an advantage of preventing an increase in the threshold voltage of the semiconductor element without involvement of occurrence of a punch-through phenomenon within the counter-doped layer.

In another aspect, in the semiconductor device having a buried-channel structure of the present invention, occurrence of a punch-through phenomenon at a position between the bottoms of the highly-doped source/drain regions within the source/drain regions of LDD structure is prevented by the punch-through stopper layer. Less-doped source/drain regions are formed at a position shallower than that of the counter-doped layer, thereby preventing occurrence of a punch-through phenomenon at a position between the bottoms of the source/drain regions. Accordingly, there is yielded an advantage of an improvement in the punch-through characteristics of the semiconductor device without an increase in the threshold voltage.

In addition, another counter-doped layer is provided on the surface of the semiconductor substrate, and hence the semiconductor device is improved in terms of controllability of the gate electrode and performance.

Since the peak of doping level of the counter-doped layer formed on the surface of the semiconductor substrate appears at a position on the surface of the semiconductor substrate, there is yielded an advantage of a further improvement in performance of the semiconductor device.

A buried-channel PMOS transistor which prevents an increase in a threshold voltage and occurrence of a punch-through phenomenon is applied to a CMOS transistor. Hence, the gate electrode of the CMOS transistor can be formed into an n-type as in an NMOS transistor, and a CMOS transistor which prevents an increase in a threshold voltage and occurrence of a punch-through phenomenon can be manufactured through a simple process.

In another aspect, source/drain regions, which are formed in a self-aligned manner through use of sidewall spacers which are of equal height and thickness, are formed such that the lower ends of the source/drain regions, where the highest electric field develops, are spaced away from each other, thereby yielding an advantage of an improvement in the punch-through resistance of the semiconductor device.

In anther aspect, in the semiconductor device having a buried-channel structure of the present invention, even when a semiconductor element is miniaturized, a punch-through stopper layer prevents occurrence of a punch-through phenomenon at a position between the bottoms of source/drain regions. Further, since a counter-doped layer is formed from two layers, there can be yielded an advantage of provision of a method of manufacturing a semiconductor device which prevents an increase in the threshold voltage of the semiconductor element without involvement of occurrence of a punch-through phenomenon within the counter-doped layer.

Moreover, a steep p-n junction can be formed along the boundary surface between a punch-through stopper layer and a counter-doped layer in contact with the punch-through stopper layer, thereby preventing a punch-through phenomenon, which would otherwise be caused by extension of a depletion layer in the p-n junction.

In another aspect, within the source/drain regions of LDD structure, occurrence of a punch-through phenomenon at a position between the bottoms of the highly-doped source/drain regions is prevented by the punch-through stopper layer. Lightly-doped source/drain regions are formed at a position shallower than that of the counter-doped layer, thereby preventing occurrence of a punch-through phenomenon at a position between the bottoms of the source/drain regions. Accordingly, there is yielded an advantage of an improvement in the punch-through resistance of the semiconductor device without an increase in the threshold voltage.

A counter-doped layer can be formed on the surface of a semiconductor substrate. Hence, there can be produced a semiconductor device whose gate electrode exhibits good controllability and which exhibits high performance.

Since the peak of doping level of the counter-doped layer facing the surface of the semiconductor substrate appears on the surface of the semiconductor substrate, there can be produced a semiconductor device of improved performance.

Since the counter-doped layer facing the surface of the semiconductor substrate is formed by means of low-energy ion implantation or oblique rotation ion implantation, a semiconductor device can be formed with good controllability even when the peak of doping level of the counter-doped layer appears at a shallow position.

Moreover, a buried-channel PMOS transistor which prevents an increase in threshold voltage and occurrence of a punch-through phenomenon is applied to a CMOS transistor. Hence, the gate electrode of-the CMOS transistor can be formed into an n-type as in an NMOS transistor, and a CMOS transistor which prevents an increase in a threshold voltage and occurrence of a punch-through phenomenon can be manufactured through a simple process.

In further aspect, source/drain regions, which are formed in a self-aligned manner through use of sidewall spacers which are of equal height and thickness, are formed such that the lower ends of the source/drain regions, where the highest electric field develops, are spaced away from each other, thereby yielding an advantage of an improvement in the punch-through resistance of the semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-297878, filed on Oct. 20, 1999 including specification, claims, drawings and summary, on which the convention priority of the present application is based, are incorporated herein by reference in its entirety.

What is claimed is:

1. A semiconductor device comprising:
 a semiconductor region of first conductivity type formed on a primary surface of a semiconductor substrate and surrounded by an isolation dielectric film;
 source/drain regions of second conductivity type which are formed on the primary surface of said semiconductor region so as to be separated a predetermined distance away from each other;
 a gate electrode of first conductivity type which is formed on the primary surface of said semiconductor region with a gate insulation film interposed therebetween, so as to face a region sandwiched between said source region and said drain region;
 a first impurity region of first conductivity type which is formed in a portion of said semiconductor region sandwiched between said source region and said drain region within the vicinity of said primary surface of said semiconductor region and which has a first concentration peak;
 a second impurity region of second conductivity type which has a second concentration peak at a position shallower than the position of said first concentration peak within said region and in the vicinity of said primary surface of said semiconductor region; and
 a third impurity region of second conductivity type which has a third concentration peak at a position shallower than the position of said second concentration peak within said region and in the vicinity of said primary surface of said semiconductor region.

2. The semiconductor device according to claim 1, wherein said third concentration peak is located on the primary surface of said semiconductor region.

3. The semiconductor device according to claim 1, wherein said first conductivity type corresponds to a negative type, and said second conductivity corresponds to a positive type; and the semiconductor device further comprises:
 a semiconductor region of second conductivity type which is formed on the primary surface of said semiconductor substrate and which, in combination with said semiconductor region of first conductivity type, sandwiches an isolation dielectric film interposed therebetween;
 source/drain regions of first conductivity type which are formed on the primary surface of said semiconductor region of second conductivity type so as to be separated a predetermined distance away from each other;
 a gate electrode of first conductivity type which is formed on the primary surface of said semiconductor region of second conductivity type with a gate insulation film interposed therebetween, so as to face a region sandwiched between said source/drain region of first conductivity; and
 an impurity region of second conductivity type which is formed in a portion of said semiconductor region of second conductivity sandwiched between said source/drain regions of first conductivity in the vicinity of the primary surface of said semiconductor region of second conductivity type.

4. A semiconductor device comprising:
 a semiconductor region of first conductivity type formed on the primary surface of a semiconductor substrate and surrounded by an isolation dielectric film;
 first source/drain regions of second conductivity type which are formed on the primary surface of said semiconductor region so as to be separated a predetermined distance away from each other;

a gate electrode of first conductivity type which is formed on the primary surface of said semiconductor region with a gate insulation film interposed therebetween, so as to face a region sandwiched between said source region and said drain region;

a first impurity region of first conductivity type which is formed in a portion of said semiconductor region sandwiched between said source region and said drain region in the vicinity of the primary surface of said semiconductor region and which has a first concentration peak;

a second impurity region of second conductivity type which has a second concentration peak located at a position shallower than the position of said first concentration peak within said region and in the vicinity of the primary surface of said semiconductor region; and second source/drain region of second conductivity type which are formed on the primary surface of the area of said semiconductor region sandwiched between said first source region and said first drain region, so as to be separated a predetermined distance apart from each other and which have a concentration peak at a position shallower than that of said second impurity concentration peak within said region and in the vicinity of the primary surface of said semiconductor region.

5. The semiconductor device according to claim 4, further comprising a third impurity region of second conductivity type which has a third concentration peak at a position shallower than that of said second impurity concentration peak and in the vicinity of the primary surface of said semiconductor region.

6. The semiconductor device according to claim 5, wherein said third concentration peak is located on the primary surface of said semiconductor region.

7. The semiconductor device according to claim 4, wherein said first conductivity type corresponds to a negative type, and said second conductivity corresponds to a positive type; and the semiconductor device further comprises:

a semiconductor region of second conductivity type which is formed on the primary surface of said semiconductor substrate and which, in combination with said semiconductor region of first conductivity type, sandwiches an isolation dielectric film interposed therebetween;

source/drain regions of first conductivity type which are formed on the primary surface of said semiconductor region of second conductivity type so as to be separated a predetermined distance away from each other;

a gate electrode of first conductivity type which is formed on the primary surface of said semiconductor region of second conductivity type with a gate insulation film interposed therebetween, so as to face a region sandwiched between said source/drain region of first conductivity; and an impurity region of second conductivity type which is formed in a portion of said semiconductor region of second conductivity sandwiched between said source/drain regions of first conductivity in the vicinity of the primary surface of said semiconductor region of second conductivity type.

8. A semiconductor device comprising:

a semiconductor region of first conductivity type formed on the primary surface of a semiconductor substrate and surrounded by an isolation dielectric film;

source/drain regions of second conductivity type which are formed on the primary surface of said semiconductor region so as to be separated a predetermined distance away from each other;

a gate electrode of first conductivity type which is formed on the primary surface of said semiconductor region with a gate insulation film interposed therebetween, so as to face a region sandwiched between said source region and said drain region;

a first impurity region of first conductivity type which is formed in said region sandwiched between said source region and said drain region and in the vicinity of the primary surface of said semiconductor region and which has a first concentration peak;

a second impurity region of second conductivity type which has a second concentration peak at a position shallower than the position of said first concentration peak and in the vicinity of the primary surface of said semiconductor region; and sidewall spacers which are formed on the side surface of said gate electrode and have substantially the same dimension in both thickness and height relative to said semiconductor substrate.

* * * * *